US011741866B2

(12) United States Patent
Kim et al.

(10) Patent No.: US 11,741,866 B2
(45) Date of Patent: Aug. 29, 2023

(54) DISPLAY DEVICE AND PAD CONTACT TEST METHOD THEREOF

(71) Applicant: Samsung Display Co., Ltd., Yongin-Si (KR)

(72) Inventors: Wontae Kim, Hwaseong-si (KR); Myeongsu Kim, Hwaseong-si (KR); Boyeon Kim, Seoul (KR); Jae-Han Lee, Hwaseong-si (KR); Whee-Won Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/389,627

(22) Filed: Jul. 30, 2021

(65) Prior Publication Data
US 2022/0172653 A1 Jun. 2, 2022

(30) Foreign Application Priority Data
Dec. 1, 2020 (KR) ........................ 10-2020-0166057

(51) Int. Cl.
*G09G 3/00* (2006.01)
*H01L 27/32* (2006.01)
*H10K 59/131* (2023.01)

(52) U.S. Cl.
CPC ........... *G09G 3/006* (2013.01); *H10K 59/131* (2023.02)

(58) Field of Classification Search
CPC ............ G09G 3/006; G09G 2300/0426; H01L 27/3276; H01L 27/3255; H01L 51/0031; H01L 2227/323; H05K 1/0268; H05K 1/111
See application file for complete search history.

(56) References Cited

U.S. PATENT DOCUMENTS

| 2014/0253158 A1* | 9/2014 | Ko | G09G 3/006 324/750.16 |
| 2015/0198641 A1* | 7/2015 | Moon | G09G 3/006 324/537 |
| 2019/0371691 A1 | 12/2019 | Han et al. | |

FOREIGN PATENT DOCUMENTS

| KR | 1020190014984 A | 2/2019 |
| KR | 102038102 B1 | 10/2019 |
| KR | 1020190137482 A | 12/2019 |

* cited by examiner

*Primary Examiner* — Mark W Regn
(74) *Attorney, Agent, or Firm* — Cantor Colburn LLP

(57) ABSTRACT

A display device includes a display panel, a main circuit board including a plurality of board pads arranged along a first direction, a connection circuit board electrically connected to the display panel and the main circuit board, and a driving chip disposed on the connection circuit board. The connection circuit board includes a plurality of board connection pads respectively connected to a plurality of board pads, a plurality of lines connecting the driving chip to the plurality of board connection pads to each other, and a test pattern disposed spaced part from the driving chip, where a first line and a second line among the lines are electrically connected to the test pattern, and a same voltage is applied to the first line and the second line.

20 Claims, 21 Drawing Sheets

DISPLAY DEVICE AND PAD CONTACT TEST METHOD THEREOF

This application claims priority to Korean Patent Application No. 10-2020-0166057, filed on Dec. 1, 2020, and all the benefits accruing therefrom under 35 U.S.C. § 119, the content of which in its entirety is herein incorporated by reference.

BACKGROUND

1. Field

The disclosure herein relates to a display device, and more particularly, to a display device including a connection circuit board.

2. Description of the Related Art

Various display devices used in multimedia devices such as televisions, mobile phones, tablet computers, navigation systems, and game machines have been developed. A display device may include a display panel for displaying images and circuit boards combined with the display panel for providing the display panel with driving signals. The display panel may include a display portion for displaying images and panel pads disposed outside the display portion to provide the display portion with the driving signals.

The circuit boards may be interconnected to each other through the pads. For example, the pads of the circuit boards may be connected to the pads of the display panel, and the circuit boards may be interconnected to each other thorough the pads. The pads are desired to be sufficiently and completely connected to each other so that control signals and image signals may be transmitted to the display panel without distortion.

SUMMARY

The disclosure provides a display device including a connection circuit board capable of testing the contact of pads.

The disclosure also provides a method for testing the contact of pads of a display device, where the method is capable of testing whether the pads are sufficiently contact each other.

An embodiment of the invention provides a display device including a display panel, a main circuit board including a plurality of board pads arranged along a first direction, a connection circuit board electrically connected to the display panel on one side thereof and electrically connected to the main circuit board on another side thereof, and a driving chip disposed on the connection circuit board. In such an embodiment, the connection circuit board includes a plurality of board connection pads respectively connected to the board pads, a plurality of lines connecting the board connection pads and the driving chip, and a test pattern disposed spaced apart from the driving chip, where a first line and a second line among the lines are electrically connected to the test pattern, and a same voltage is applied to the first line and the second line.

In an embodiment, the first line and the second line may be electrically connected to each other through the test pattern.

In an embodiment, the test pattern may include a plurality of stripe patterns arranged along one direction and a border pattern connected to opposing ends of each of the stripe patterns.

In an embodiment, widths of the stripe patterns of the test pattern may be the same as each other in a plan view.

In an embodiment, the test pattern may further include a metal film covering the stripe patterns.

In an embodiment, the test pattern may include an integrated plate-shaped pattern.

In an embodiment, the first line and the second line may be spaced apart from each other along the first direction and have a shape symmetrical to each other with respect to an imaginary central axis extending along a second direction crossing the first direction. In such an embodiment, the test pattern may be symmetrical with respect to the imaginary central axis.

In an embodiment, a line resistance of the first line and a line resistance of the second line may be the same as each other.

In an embodiment, the connection circuit board may further include a first connection line which electrically connects the first line and the test pattern to each other, and a second connection line which electrically connects the second line and the test pattern to each other, and the first line and the second line may be respectively electrically connected to the first connection line and the second connection line on a region overlapping the driving chip.

In an embodiment, the board pads and the board connection pads may be bonded by a conductive adhesive member.

In an embodiment, the connection circuit board may further include a first sub-test pattern and a second sub-test pattern, and each of the first sub-test pattern and the second sub-test pattern may be electrically connected to the test pattern.

In an embodiment, an area of the first sub-test pattern and an area of the second sub-test pattern may be the same as each other in a plan view.

In an embodiment, the test pattern, the first sub-test pattern, and the second sub-test pattern may comprise a same material as each other.

In an embodiment, the first sub-test pattern and the second sub-test pattern may be spaced apart from each other with the test pattern interposed therebetween in a plan view.

In an embodiment, each of the first sub-test pattern and the second sub-test pattern may have an integrated plate shape.

In an embodiment, each of the first sub-test pattern and the second sub-test pattern may include a plurality of stripe patterns connected to each other.

In an embodiment, a third line and a fourth line among the lines may be electrically connected to the test pattern, a same voltage may be applied to the third line and the fourth line, and the same voltage applied to each of the third line and the fourth line may be different from the same voltage applied to the first line and the second line.

An embodiment of the invention provides a method for testing contacts of pads of a display device, where the display device includes: a display panel; a main circuit board; and a connection circuit board with a driving chip disposed thereon, which is electrically connected to the display panel and the main circuit board, where: the main circuit board comprises a plurality of board pads; the connection circuit board includes a plurality of board connection pads respectively connected to the board pads, a plurality of lines connecting the board connection pads and the driving chip to each other, and a test pattern disposed spaced apart from the driving chip; and a first line and a second line among the lines are spaced apart from each other and electrically connected to the test pattern. In such an embodiment, the method includes: inputting a same test signal to a first board connection pad among the board connection pads, which is connected to the first line, and a second board connection pad among the board connection pads, which is connected to the second line; and measuring a voltage of the test pattern.

In an embodiment, the connection circuit board may further include a first sub-test pattern electrically connected to the first line and a second sub-test pattern electrically connected to the second line, and the method may further include, after the inputting the same test signal, cutting the test pattern, inputting a same test signal to the first board connection pad and the second board connection pad, and measuring a voltage of each of the first sub-test pattern and the second sub-test pattern.

In an embodiment, the method may further include, after the measuring the voltage of each of the first sub-test pattern and the second sub-test pattern, connecting cut portions of the test pattern to each other.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
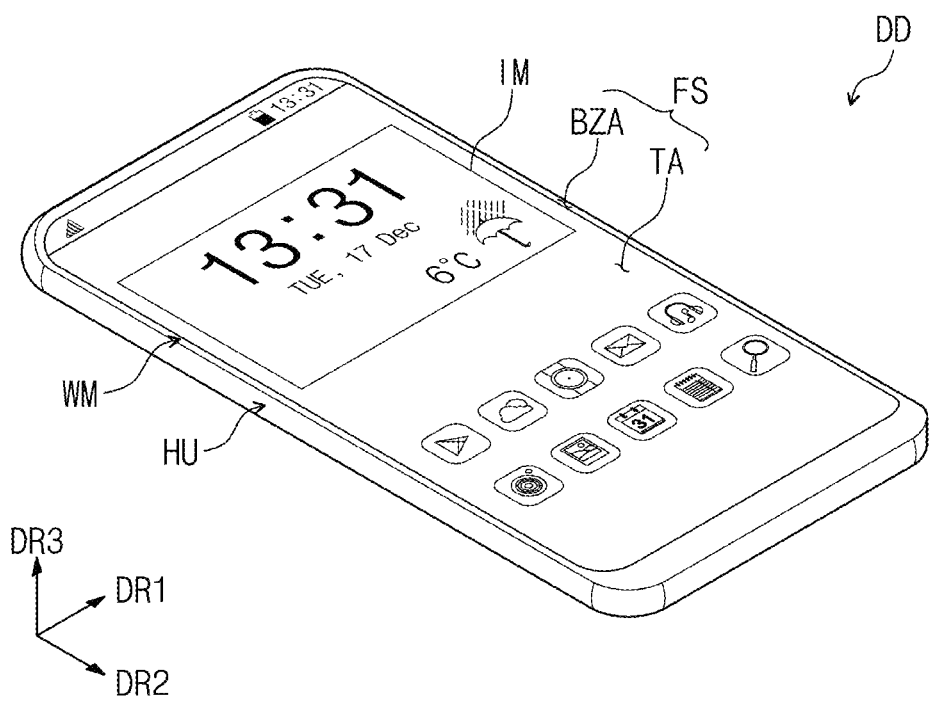
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, portion, etc.) is referred to as being "on", "connected to" or "coupled to" another element, it can be directly on, connected to or coupled to the other element, or intervening elements may be present. In contrast, when an element is referred to as being "directly on", "connected directly to" or "coupled directly to" another element, there are no intervening elements present.

Like reference numerals refer to like elements throughout. In addition, in the drawings, the thicknesses, ratios, and dimensions of elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device and a method for testing the contact of pads thereof will be described in detail with reference to the accompanying drawings.

Figure 1B:
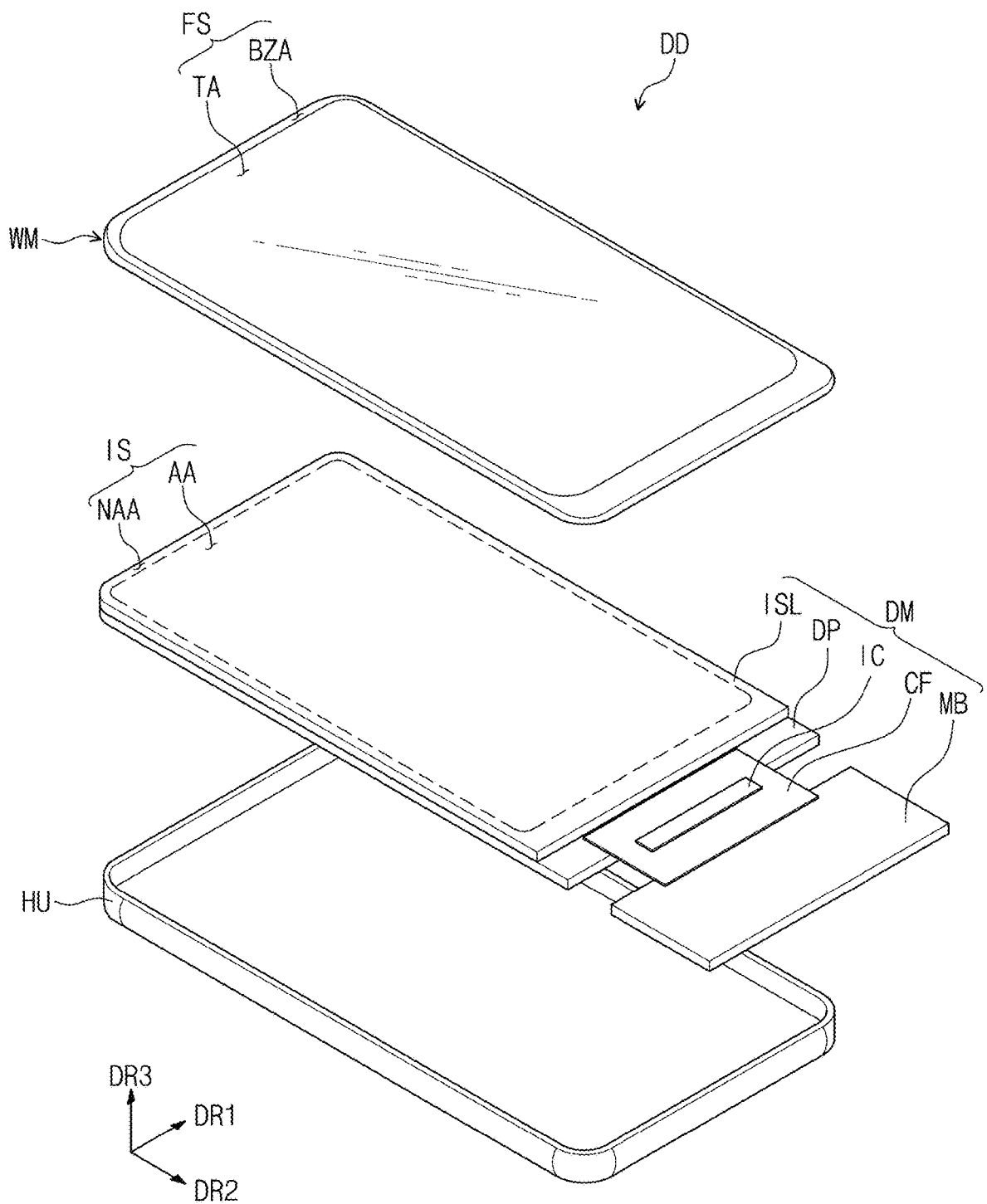
FIG. 1B is an exploded perspective view of the display device according to an embodiment of the invention.

FIG. 1A is a perspective view of a display device according to an embodiment of the invention. FIG. 1B is an exploded perspective view of the display device according to an embodiment of the invention.

The display device DD may be activated based on an electrical signal applied thereto. The display device DD may be included in or applied to various types of electronic device such as a mobile phone, a smart watch, a tablet, a notebook computer, a computer, and a smart television, but not being limited thereto. and may be used for or applied to other types of electronic device without departing from the concept of the invention. In an embodiment, the display device DD may be a mobile phone as shown in FIG. 1.

The display device DD may display an image IM toward a third direction DR3 on a display surface FS parallel to each of a first direction DR1 and a second direction DR2. The display surface FS for displaying the image IM may correspond to the front surface of the display device DD. The image IM may include a still image as well as a dynamic image. FIG. 1A illustrates an embodiment where the image IM includes a watch widget and icons.

In an embodiment, the front surface (or upper surface) and rear surface (or lower surface) of each member are defined on the basis of a direction in which the image (IM) is displayed. The front surface and the rear surface may be opposing each other in the third direction DR3, and the normal direction of each of the front and rear surfaces may be parallel to the third direction DR3. A separation distance between the front surface and the rear surface in the third direction DR3 may correspond to the thickness of the display device DD in the third direction DR3. Herein, the phrase "when viewed on a plane (or in a plan view)" may mean when viewed in the third direction DR3. Herein, a direction pointed to by the first to third directions DR1, DR2, and DR3 is a relative concept and may be transformed into another direction.

The display device DD may sense an external input applied from an outside. The external input may include various forms of inputs provided from an outside of the display device DD. The external input may have various forms such as force, pressure, temperature, and light. In one embodiment, for example, the external input may include contact by a part of a body (e.g. a user's hand), as well as an external input (e.g. hovering) applied in proximity to the display device DD or adjacent to a predetermined distance therefrom.

In an embodiment, as shown in FIG. 1B, the display device DD may include a window WM and a housing HU. The window WM and the housing HU may be combined to form the exterior of the display device DD.

The window WM may be divided into a transmission region TA and a bezel region BZA. The front surface of the display device DD may correspond to the transmission region TA and the bezel region BZA.

The transmission region TA may be a region through which the image IM is displayed. The transmission region TA may be an optically transparent region. A user may visually recognize the image IM through the transmission region TA.

In an embodiment, the transmission region TA may have a rounded square shape, for example, but not being limited thereto. In such an embodiment, the transmission region TA may have one of various shapes, but not being limited to any particular shape.

The bezel region BZA may be a region having a relatively low light transmittance compared to the transmission region TA. In one embodiment, for example, the bezel region BZA may be provided as a region in which a material having a predetermined color is printed.

The bezel region BZA may be a region adjacent to the transmission region TA. The bezel region BZA may surround the transmission region TA. Accordingly, the shape of the transmission region TA may be substantially defined by the bezel region BZA, for example, but not being limited thereto. Alternatively, the bezel region BZA may be disposed adjacent to only one side of the transmission TA or may be omitted.

Referring to FIG. 1B an embodiment of the display device DD may include a window WM, a display module DM, and a housing HU. The display module DM may include a display panel DP, an input sensing unit ISL, a connection circuit board CF, a driving chip IC, and a main circuit board MB.

The window WM may be disposed on the display module DM. The window WM may protect the display module DM.

The window WM may include an optically transparent material. In one embodiment, for example, the window WM may include at least one selected from glass, sapphire, plastic, and the like. An image provided from the display module DM may be provided to a user through the window WM.

The window WM may have a single-layered structure or a multi-layered structure. In one embodiment, for example, the window WM may include a plurality of plastic films connected (or attached) to each other, or a glass substrate and a plastic film connected to each other.

In an embodiment, the display module DM may include a front surface IS including an active region AA and a non-active region NAA. The active region AA may be a region which is activated based on an electrical signal. In such an embodiment, the active region AA may be not only a region in which the image is displayed, but also a region in which an external input is sensed.

The transmission region TA may overlap at least a portion of the active region AA, such that a user may visually recognize the image through the transmission region TA and provide an external input therethrough, for example, but not being limited thereto. Alternatively, a region in which the image is displayed and a region in which an external input is sensed may be separated from each other in the active region AA, but not being limited thereto.

The non-active region NAA may be covered by the bezel region BZA. The non-active region NAA is adjacent to the active region AA. The non-active region NAA may surround the active region AA. In the non-active region NAA, a driving circuit or a driving line may be disposed to drive the active region AA.

In an embodiment, a display panel DP may be a liquid crystal display panel or a light-emitting display panel, but is not particularly limited thereto. In one embodiment, for example, the light-emitting display panel may be an organic light-emitting display panel or a quantum dot light-emitting display panel. The light-emitting layer of the organic light-emitting display panel may include an organic light-emitting material. The light-emitting layer of the quantum dot light-emitting display panel may include quantum dots, quantum rods, or the like.

The display panel DP may be flexible. Herein, the term "flexible" means having a property that can be bent, and may include a structure that can be completely folded or a structure that can be partially bent. In one embodiment, for example, the display panel DP may be a curved display panel or a foldable display panel. Alternatively, the display panel DP may be rigid.

The input sensing unit ISL may be disposed on the display panel DP. In an embodiment, as illustrated in FIG. 1B, the input sensing unit ISL may be directly disposed or formed on the display panel DP. In such an embodiment, the input sensing unit ISL may be formed on the display panel DP by a continuous process, and an adhesive film may not be disposed between the input sensing unit ISL and the display panel DP. However, the embodiment of the invention is not limited thereto. In an alternative embodiment, an adhesive film nay be disposed between the input sensing unit ISL and the display panel DP. In such an embodiment, the input sensing unit ISL may be manufactured through a separate process and then fixed on the upper surface of the display panel DP by an adhesive film.

The input sensing unit ISL may sense an external input applied from the outside. In such an embodiment, as described above, the input sensing unit ISL may sense the external input provided on the window WM.

The connection circuit board CF may connect the display panel DP and the main circuit board MB. The connection circuit board CF may be electrically connected to the display panel DP on one side thereof adjacent to the display panel DP. The connection circuit board CF may be electrically connected to the main circuit board MB on another side thereof adjacent to the main circuit board MB.

In an embodiment, a single connection circuit board CF for connecting the display panel DP and the main circuit board MB to each other may be provided, but not being limited thereto. Alternatively, the connection circuit board may be provided in plural to connect the display panel DP and the main circuit board MB to each other.

The connection circuit board CF may be a flexible printed circuit board.

The connection circuit board CF may provide the display panel DP with an electrical signal to drive the display panel DP. The electrical signal may be generated from the connection circuit board CF or the main circuit board MB.

The driving chip IC may be disposed or mounted on the connection circuit board CF. The driving chip IC may be mounted on the flexible printed circuit board to form a chip on film ("COF").

The driving chip IC may include driving elements to drive pixels of the display panel DP. The driving chip IC may include a driving circuit, and the driving circuit may be defined by or formed of an integrated circuit. The driving circuit may include a driving controller, a data driver, a voltage generator, and the like.

The main circuit board MB may include a main controller. The main circuit board MB may include signal lines for transmitting control signals and image signals, which are received from the main controller, to the connection circuit board CF and the display panel DP. The main circuit board MB may be a rigid printed circuit board or a flexible printed circuit board.

In an embodiment, although not illustrated, an input circuit board, which is electrically connected to the input sensing unit ISL, may be further included. The input circuit board may connect the input sensing unit ISL and the main circuit board MB to each other. In such an embodiment, the input circuit board is provided as a flexible circuit film and may connect the input sensing unit ISL and the main circuit board MB. The input circuit board provides the input sensing unit ISL with an electrical signal for driving the input sensing unit ISL. The electrical signal may be generated from the input circuit board or the main circuit board MB.

In an embodiment, each of the connection circuit board CF and the input circuit board may be connected to a same main circuit board MB. Alternatively, one of the connection circuit board CF and the input circuit board may not be connected to the main circuit board MB, but not being limited thereto.

The housing HU may be combined with the window WM to provide a predetermined internal space. The display module DM may be accommodated in the internal space. The housing HU may protect the display module DM accommodated in the internal space from an external impact, and may prevent a foreign substance or moisture from entering into the display module DM.

In an embodiment, the display device DD may further include an electronic module including various functional modules for operating the display module DM, a power supply module for supplying power necessary for overall operation of the display device DD, a bracket for dividing the internal space of the display device DD with the combination of the display module DM and/or the housing HU.

Figure 2:
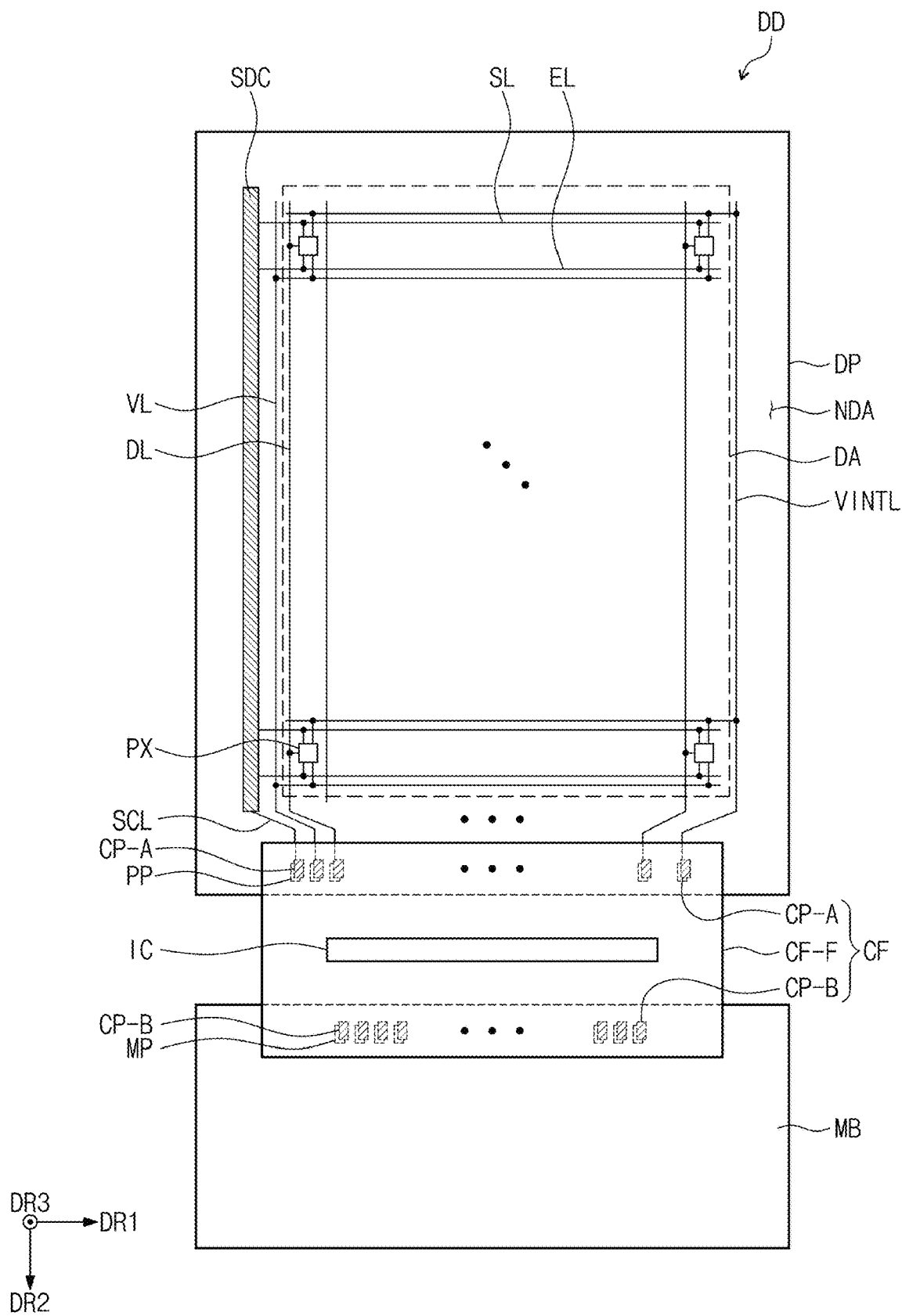
FIG. 2 is a plan view of the display device according to an embodiment of the invention.
Figure 3:
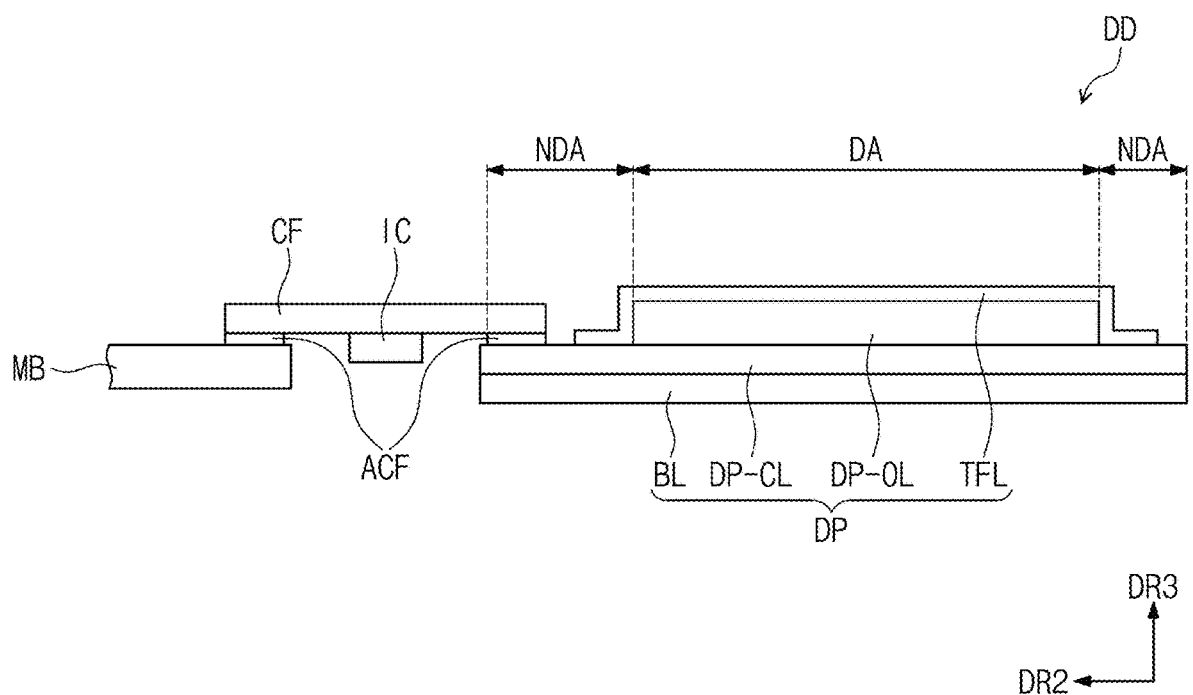
FIG. 3 is a cross-sectional view of the display device according to an embodiment of the invention.

FIG. 2 is a plan view of the display device according to an embodiment of the invention. FIG. 3 is a cross-sectional view of the display device according to an embodiment of the invention.

Referring to FIG. 2, when viewed on a plane or in a plan view, the display panel DP may include a display region DA and a non-display region NDA defined thereon. The display region DA may be a region in which an image is displayed. The non-display region NDA may be a region in which the image is not displayed. The non-display region NDA may be a region adjacent to the display region DA. The non-display region NDA may surround the display region DA, but the shape thereof is not limited thereto.

The display panel DP may include a plurality of pixels PX, a scan driving circuit SDC, a plurality of signal lines, and a plurality of panel pads PP. The display panel DP may include signal lines such as scan lines SL, light-emitting lines EL, data lines DL, a scan control line SCL, an initialization voltage line VINTL, and a voltage line VL.

Each of the pixels PX may include a display element and a thin-film transistor electrically connected to the display element. The display element may include, for example, an organic light-emitting diode. The pixels PX may be disposed in the display region DA. Alternatively, without being limited thereto, a portion of the pixels PX may be disposed in the non-display region NDA.

The pixels PX may be disposed in a matrix form along the first direction DR1 and the second direction DR2 perpendicular to each other. In an embodiment of the invention, each of the pixels PX may include first to third pixels for displaying a red color, a green color, and a blue color, respectively. In an embodiment, the pixels PX may further include a pixel for displaying white, cyan, or magenta color.

In an embodiment, the scan driving circuit SDC may be disposed adjacent to one side of the non-display region NDA. Alternatively, without being limited thereto, the scan driving circuit SDC may be disposed within the display region DA. The scan driving circuit SDC may generate a plurality of scan signals and sequentially output the generated scan lines to the scan line SL to be described later. The scan driving circuit SDC may further output another control signal to the driving circuit of the pixels PX.

The scan lines SL may extend along the first direction DR1 from the scan driving circuit SDC and be respectively connected to a corresponding pixel among the plurality of pixels PX. Each of the light-emitting lines EL may extend along the first direction DR1 from the scan driving circuit SDC and be arranged parallel to a corresponding scan line among the scan lines SL. The scan lines SL and the light-emitting lines EL may be connected to the scan driving circuit SDC.

The data lines DL may extend along the second direction DR2 and each be connected to a corresponding pixel PX among the plurality of pixels PX. The scan control line SCL may provide control signals to the scan driving circuit SDC.

The initialization voltage line VINTL may provide an initialization voltage to the plurality of pixels PX. The voltage line VL may be connected to the plurality of pixels PX and provide a voltage to the plurality of pixels PX. The voltage line VL may include a plurality of lines extending along the first direction DR1 and a plurality of lines extending along the second direction DR2.

Some of the scan lines SL, the data lines DL, the light-emitting lines EL, the scan control line SCL, the initialization voltage line VINTL, and the voltage line VL may be disposed in a same layer as each other, and the others thereof may be disposed in a different layer from the some thereof.

The panel pads PP may be arranged within the non-display region NDA. The panel pads PP may be arranged parallel to the first direction DR1. In an embodiment, the panel pads PP may be arranged in a line along the first direction DR1, but not being limited thereto. In one alternative embodiment, for example, the panel pads PP may be arranged in two or more roe or may be arranged in a zigzag shape. The panel pads PP may be connected to the data lines DL, the scan control line SCL, the initialization voltage line VINTL, and the voltage line VL.

The connection circuit board CF may include a base layer CF-F, a plurality of panel connection pads CP-A, and a plurality of board connection pads CP-B.

The base layer CF-F may be an insulating layer in which the plurality of panel connection pads CP-A and the plurality of board connection pads CP-B are disposed. The base layer CF-F may include a flexible film.

The panel connection pads CP-A nay be arranged along the first direction DR1 on one side adjacent to the display panel DP. The panel connection pads CP-A may be connected to the panel pads PP of the display panel DP, which correspond to the panel connection pads CP-A, respectively.

The panel pads PP may be arranged on the front surface of the display panel DP, and the panel connection pads CP-A may be arranged on the rear surface of the base layer CF-F. Alternatively, without being limited thereto, the panel pads PP may be arranged on the rear surface of the display panel DP, and the panel connection pads CP-A may be arranged on the front surface of the base layer CF-F.

The board connection pads CP-B may be arranged along the first direction DR1 on another side adjacent to the main circuit board MB. The board connection pads CP-B may be spaced apart from the panel connection pads CP-A along the second direction DR2. In an embodiment, the board connection pads CP-B may be arranged on the rear surface of the base layer CF-F. Alternatively, without being limited thereto, the board connection pads CP-B may be arranged on the front surface of the base layer CF-F.

In an embodiment, the connection circuit board CF may include a plurality of lines. The plurality of lines may transmit electrical signals to elements respectively connected to one end and the other end thereof. The plurality of lines may include lines for electrically connecting the panel connection pads CP-A and the driving chip IC to each other and lines for electrically connecting the board connection pads CP-B and the driving chip IC to each other. The plurality of lines may be disposed on the base layer CF-F.

The main circuit board MB may include a plurality of board pads MP. Although not illustrated, the main circuit board MB may include a plurality of lines connected to the board pads MP.

The board pads MP may be arranged along the first direction DR1 on one side adjacent to the connection circuit board CF. The board pads MP may be arranged on the front surface of the main circuit board MB. Alternatively, without being limited thereto, the board pads MP may be arranged on the rear surface of the main circuit board MB.

The board pads MP may be connected to the board connection pads CP-B of the connection circuit board CF corresponding to each of the board pads MP. Each of the board connection pads CP-B may be electrically connected to the main controller through lines and may receive control signals and image signals from the main controller. The board pads MP may transmit the received signals to the board connection pads CP-B.

For better understanding of the connections between the panel pads PP and the panel connection pads CP-A and between the board pads MP and the board connection pads CP-B, FIG. 2 illustrates an embodiment where the pads are misaligned to each other, but the pads may be respectively connected to each other by overlapping the corresponding pads.

When the panel pads PP and the panel connection pads CP-A are sufficiently and completely connected to each other, the control signals and image signals received from the driving circuit of the driving chip IC may be transmitted to the display panel DP without distortion. When the board pads MP and the board connection pads CP-B are sufficiently and completely connected to each other, the control signals and image signals received from the main controller of the main circuit board MB may be transmitted to the driving circuit of the driving chip IC without distortion.

FIG. 3 is a cross-sectional view of the display device illustrated in FIG. 2. In an embodiment, the display panel DP may include a base substrate BL, a circuit element layer DP-CL, a display element layer DP-OL, and an encapsulation layer TFL.

The base substrate BL may be a display substrate on which the circuit element layer DP-CL and the display element layer DP-OL are disposed. The base substrate BL may have a stacked structure including at least one selected from a silicon substrate, a plastic substrate, a glass substrate, an insulating film, and a plurality of insulating layers.

The circuit element layer DP-CL may be disposed on the base substrate BL. The circuit element layer DP-CL includes a plurality of insulating layers, conductive layers, and a semiconductor layer. The plurality of conductive layers may constitute the scan driving circuit SDC, the signal lines (e.g. the scan lines SL, the light-emitting lines EL, the data lines DL, the scan control line SCL, the initialization voltage line VINTL, and the voltage line VL), and a control circuit of the pixels PX illustrated in FIG. 2.

The display element layer DP-OL may be disposed on the circuit element layer DP-CL. The display element layer DP-OL may include the display element included in the pixels PX illustrated in FIG. 2. In one embodiment, for example, the display element layer DP-OL may include organic light-emitting diodes. The display element layer DP-OL may further include an organic layer such as a pixel-defining film.

The encapsulation layer TFL may be disposed on the display element layer DP-OL. The encapsulation layer TFL includes a plurality of thin films. one of the thin films may be disposed to improve optical efficiency, and another of the thin films may be disposed to protect a light-emitting element.

In an embodiment, the connection circuit board CF may further include a conductive adhesive member ACF. The conductive adhesive member ACF may bond the panel pads PP of the display panel DP and the panel connection pads CP-A of the connection circuit board CF to each other. The conductive adhesive member ACF may bond the board pads MP of the main circuit board MB and the board connection pads CP-B of the connection circuit board CF to each other.

In an embodiment, the conductive adhesive member ACF may be an anisotropic conductive film. The conductive adhesive member ACF may include a plurality of conductive balls for electrically connecting the pads and an adhesive resin in which the conductive balls are dispersed.

However, the above embodiment is merely one embodiment. Alternatively, the conductive adhesive member ACF may be variously modified, as long as the conductive adhesive member ACF is configured to electrically connect the pads to each other, without being limited to any particular embodiment.

Figure 4:
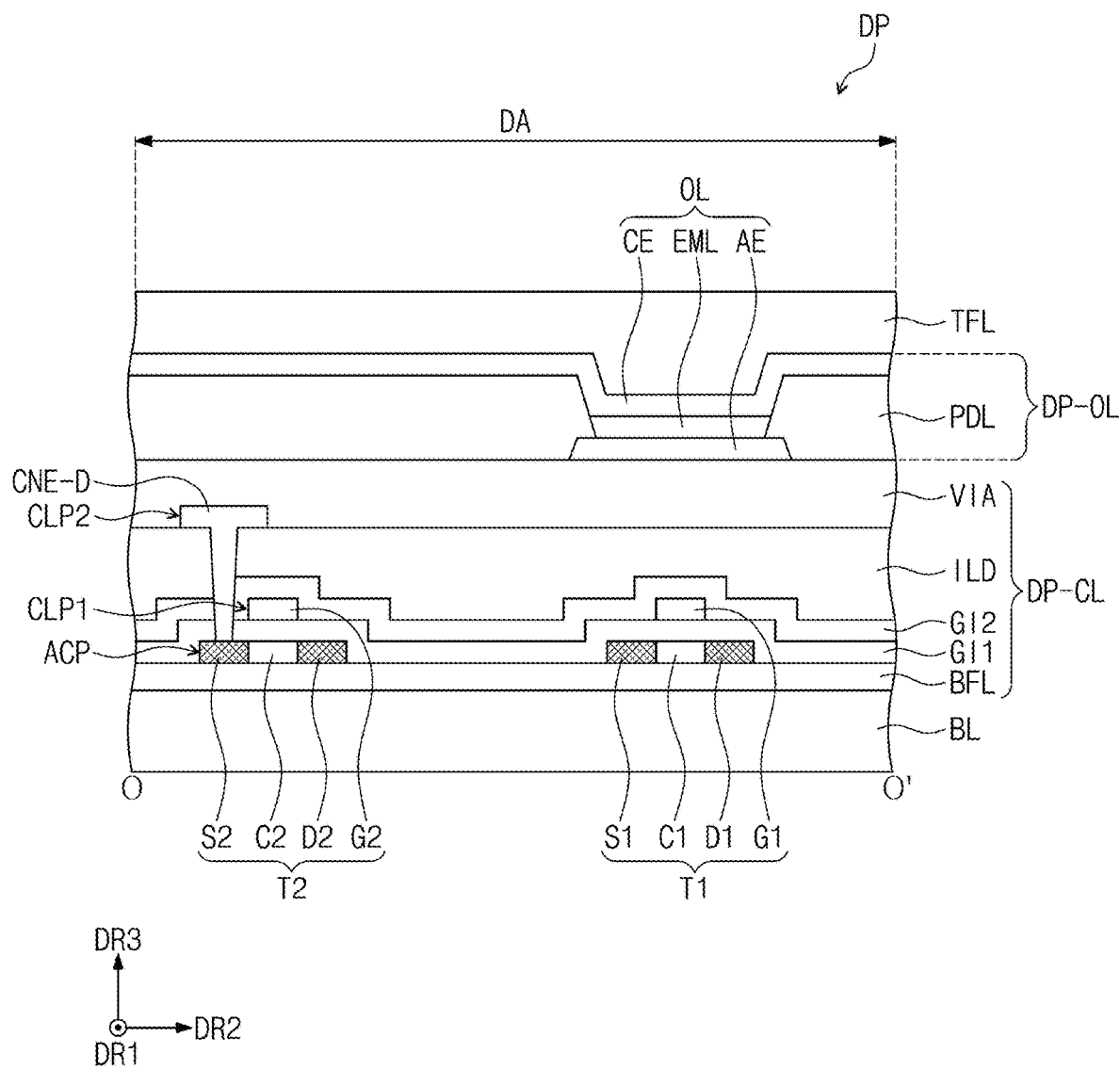
FIG. 4 is a cross-sectional view of a display panel according to an embodiment of the invention.

FIG. 4 is a cross-sectional view of the display panel according to an embodiment of the invention. FIG. 4 is a partial cross-sectional view corresponding to one pixel disposed in the display region DA of the display panel DP.

Referring to FIG. 4, in an embodiment, the circuit element layer DP-CL may include a buffer layer BFL, a first gate insulating layer GI1, a second gate insulating layer GI2, an interlayer insulating layer ILD, an upper insulating layer VIA, a semiconductor pattern ACP including a plurality of patterns, a first conductive layer CLP1 including a plurality of patterns, and a second conductive layer CLP2 including a plurality of patterns.

The buffer layer BFL may be disposed on the base substrate BL. The buffer layer BFL may have a single-layered structure or a multi-layered structure.

The buffer layer BFL prevents impurities or moisture introduced from the outside from diffusing into the semiconductor pattern ACP of transistors T1 and T2 constituting the pixel PX. The impurities may be introduced from the outside, or may be generated by pyrolysis of the base substrate BL. The impurities may be gas or sodium discharged from the base substrate BL.

The semiconductor pattern ACP may be disposed on the buffer layer BFL. The semiconductor pattern ACP may constitute the transistors T1 and T2. The semiconductor pattern ACP may include polysilicon, amorphous silicon, or metal oxide semiconductor. FIG. 4 illustrates an embodiment where a semiconductor pattern constitutes or defines a source S1, an active part C1, and a drain D1 of a first transistor T1, and a semiconductor pattern constituting a source S2, an active part C2, and a drain D2 of a second transistor T2.

The first gate insulating layer GI1 may be disposed on the buffer layer BFL and cover the semiconductor pattern ACP. The first conductive layer CLP1 may be disposed on the first gate insulating layer GI1. The first conductive layer CLP1 may include a first gate metal pattern. In one embodiment, for example, a gate G1 of the first transistor T1 and a gate G2 of the second transistor T2 may be defined by the first conductive layer CLP1. Although not illustrated, in an embodiment of the invention, the first conductive layer CLP1 may include any one of two electrodes constituting the capacitor of the pixel.

The second gate insulating layer GI2 may be disposed on the first gate insulating layer GI1 and cover the first conductive layer CLP1. The interlayer insulating layer ILD may be disposed on the second gate insulating layer GI2.

In an embodiment of the invention, each of the first gate insulating layer GI1, the second gate insulating layer GI2, and the interlayer insulating layer ILD includes an organic film and/or an inorganic film. In an embodiment of the invention, each of the first gate insulating layer GI1, the second gate insulating layer GI2, and the interlayer insulating layer ILD may include a plurality of inorganic thin films. In one embodiment, for example, the plurality of inorganic thin films may include a silicon nitride layer and a silicon oxide layer, but not being limited thereto.

The second conductive layer CLP2 may include a first data metal pattern. The second conductive layer CLP2 may constitute a connection electrode CNE-D. The connection electrode CNE-D may be connected to each of the gate G1 of the first transistor T1 and the source S2 of the second transistor T2. The upper insulating layer VIA may be disposed on the interlayer insulating layer ILD and cover the second conductive layer CLP2.

In an embodiment of the invention, each of the first conductive layer CLP1 and the second conductive layer CLP2 may include a metal layer. The first conductive layer CLP1 may include molybdenum (Mo). The second conductive layer CLP2 may include at least one selected from aluminum (Al) and titanium (Ti). The second conductive layer CLP2 may have a structure in which titanium, aluminum, and titanium are sequentially stacked. However, the materials of the first conductive layer CLP1 and the second conductive layer CLP2 are not limited to those described above.

In the display region DA, the display element layer DP-OL may include a display element OL and a pixel-defining film PDL. The display element OL may include a first electrode AE, a light-emitting layer EML, and a second electrode CE.

The first electrode AE may be disposed on the upper insulating layer VIA of the circuit element layer DP-CL. The first electrode AE may be electrically connected to the second conductive layer CLP2 through a contact hole.

The pixel-defining film PDL may be disposed on the circuit element layer DP-CL, and an opening is defined through the pixel-defining film PDL to expose a portion of the first electrode AE. The light-emitting layer EML may be disposed on the exposed first electrode AE. The second electrode CE may be disposed on the light-emitting layer EML. In an embodiment where the display element OL is an organic light-emitting diode, the light-emitting layer EML may include an organic material.

The encapsulation layer TFL may seal the display element layer DP-OL to protect the display element layer DP-OL from external oxygen or moisture. The encapsulation layer TFL may be a layer in which an organic layer and an inorganic layer are stacked one on another.

Figure 5:
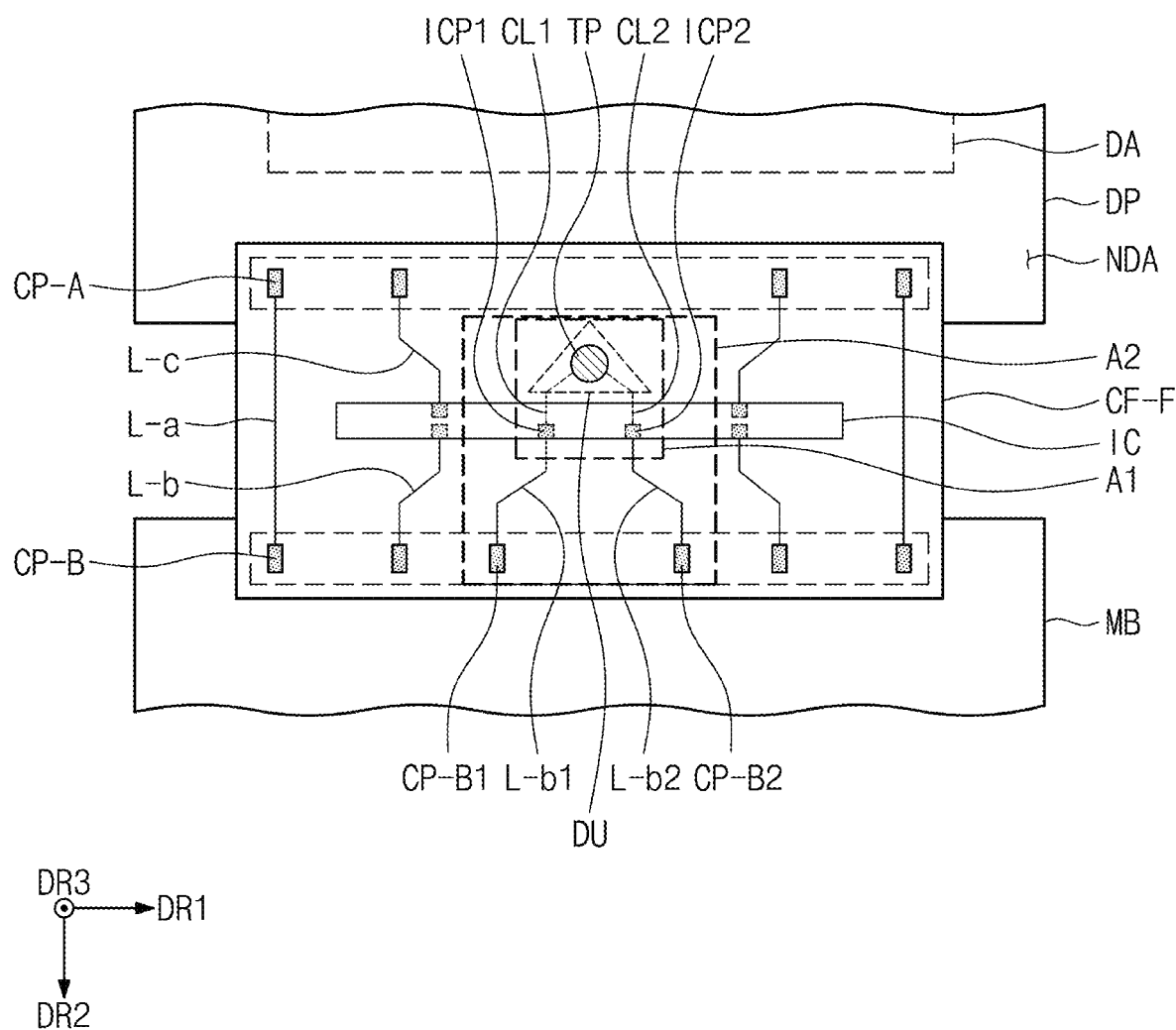
FIG. 5 is a partial enlarged plan view of the display device according to an embodiment of the invention.

FIG. 5 is an enlarged plan view illustrating the connection circuit board portion among the configurations of the display device according to an embodiment of the invention.

An embodiment of the connection circuit board CF includes a base layer CF-F, a plurality of panel connection pads CP-A, a plurality of board connection pads CP-B, a plurality of lines connected to pads, and a test pattern TP. FIG. 5 illustrates, for convenience of illustration, only some of a plurality of pads and lines.

In an embodiment, the panel connection pads CP-A, the board connection pads CP-B, and the driving chip IC may be disposed on the rear surface of the base layer CF-F of the connection circuit board CF. For the convenience of illustration, the panel connection pads CP-A, the board connection pads CP-B, the driving chip IC, and a plurality of lines are illustrated in solid line, and a portion overlapping the driving chip IC is illustrated in dotted line in FIG. 5.

The driving chip IC may be disposed or mounted on a central part of the connection circuit board CF. The driving chip IC may receive a signal from the main circuit board MB and transmit the signal to the display panel DP. The driving chip IC may include driving pads ICP1 and ICP2 which are electrically connected to the panel connection pads CP-A or the board connection pads CP-B.

The panel connection pads CP-A may be arranged along the first direction DR1 on one side of the base layer CF-F adjacent to the display panel DP. The panel connection pads CP-A may be connected to the panel pads PP (see FIG. 2) of the display panel DP and bonded to the panel pads PP (see FIG. 2) by the conductive adhesive member ACF (see FIG. 3).

The board connection pads CP-B may be arranged along the first direction DR1 on another side of the base layer CF-F adjacent to the main circuit board MB. The board connection pads CP-B may be spaced apart from the panel connection pads CP-A in the second direction DR2. The board connection pads CP-B may be connected to the board pads MP (see FIG. 2) of the main circuit board MB and bonded to the board pads MP (see FIG. 2) by the conductive adhesive member ACF (see FIG. 3).

Each of the plurality of lines of the connection circuit board CF may be electrically connected to a corresponding one of the panel connection pad CP-A, the board connection pad CP-B, and the driving pads ICP. Some of the plurality of lines may be a bypass signal line L-a for directly connecting the panel connection pad CP-A and the board connection pad CP-B to each other. The main circuit board MB may directly transmit a signal to the display panel DP through the bypass signal line L-a.

Some of the plurality of lines may be main signal lines L-b and L-c for connecting the driving pads ICP1 and ICP2 of the driving chip IC, and some of the panel connection pads CP-A and the board connection pads CP-B to each other. The main signal lines L-b and L-c may include an input signal line L-b for connecting the board connection pad CP-B and a driving pad ICP1 to each other, and an output signal line L-c for connecting a driving pad ICP2 and the panel connection pad CP-A to each other.

A first board connection pad CP-B1 and a second connection pad CP-B2 among the plurality of board connection pads CP-B may be the pads which receive a same signal as each other from the main circuit board MB.

A line for electrically connecting the first board connection pad CP-B1 and the driving chip IC may be defined as a first line L-b1. A line for electrically connecting the second board connection pad CP-B2 and the driving chip IC may be defined as a second line L-b2. Each of the first line L-b1 and the second line L-b2 may receive a same voltage as each other from the main circuit board MB.

The first line L-b1 may be electrically connected to the driving chip IC through a first driving pad ICP1. The second line L-b2 may be electrically connected to the driving chip IC through a second driving pad ICP2. The first line L-b1 and the second line L-b2 may transmit a same signal received from the main circuit board MB to the driving chip IC.

A line resistance of the first line L-b1 and a line resistance of the second line L-b2 may be substantially the same as each other. Line resistances may vary depending on materials included in lines, lengths and cross-sectional areas thereof. In one embodiment, for example, the lengths and cross-sectional areas of the first line L-b1 and the second line L-b2 may be substantially the same as each other and include a same material as each other. The first line L-b1 and the second line L-b2 may be simultaneously formed through a same process. The first line L-b1 and the second line L-b2 may have a same line resistance, thereby minimizing the voltage difference between the lines for transmitting a same signal as each other.

A dummy region DU, adjacent to the driving chip IC and in which the plurality of main signal lines L-b and L-c are not disposed, may be defined on the connection circuit board CF.

The test pattern TP may be disposed on the base layer within the dummy region DU. The test pattern TP may be spaced apart from the driving chip IC. The test pattern TP is a configuration or element for testing whether or not the pads of the connection circuit board CF are sufficiently connected to each other.

The test pattern TP may be electrically connected to each of the first board connection pad CP-B1 and the second board connection pad CP-B2 which receives a same signal as each other from the main circuit board MB. The test pattern TP may be electrically connected to the first line L-b1 connected to the first board connection pad CP-B1 and to the second line L-b2 connected to the second board connection pad CP-B2.

The test pattern TP may include a same material as the lines L-b1 and L-b2. In one embodiment, for example, the test pattern TP may include copper. Alternatively, without being limited thereto, a portion of the test pattern TP may include a metal material different from that of the lines L-b1 and L-b2.

The test pattern TP may be simultaneously formed through a same process as that of forming the lines L-b1 and L-b2. Alternatively, without being limited thereto, the test pattern TP may be formed through an additional process after the lines L-b1 and L-b2 have been formed.

The shape of the test pattern TP of the invention may vary according to a pad contact test step or electrically connected lines. The test pattern TP may include a first test pattern TP1, a second test pattern TP2, and a third test pattern TP3 according to the pad contact test process.

The first test pattern TP1 may be a test pattern before a pad contact test. The first test pattern TP1 may be a pattern which electrically connects the lines connected respectively to the test pattern.

The second test pattern TP2 may be a test pattern obtained by cutting off a portion of the first test pattern TP1 during the pad contact test process. The second test pattern TP2 may be a pattern which insulates a part of the lines respectively connected to the test pattern.

The third test pattern TP3 may be a test pattern after a pad contact test. The third test pattern TP3 may be a test pattern which bonds a cut portion of the second test pattern TP2. The third test pattern TP3 may electrically connect the lines connected respectively to the test pattern.

The first test pattern TP1, the second test pattern TP2, and the third test pattern TP3 will be described later in greater detail.

The test pattern TP may electrically connect the first line L-b1 and the second line L-b2, which are electrically connected to the test pattern TP, to each other. A bonding resistance of the board connection pad may vary depending on the difference in the degree of contact between the board connection pad and the board pad. Since the bonding resistance of the first board connection pad CP-B1 and the bonding resistance of the second board connection pad P-B2 are different from each other, a deviation may occur between a voltage applied to the first line L-b1 and a voltage applied to the second line L-b2. In such an embodiment, since the first line L-b1 and the second line L-b2 are electrically connected to each other, the deviation in voltage between the first line L-b1 and the second line L-b2 caused by the difference in bonding resistance may be eliminated.

The test pattern TP and the lines L-b1 and L-b2 electrically connected to the test pattern TP may have a symmetrical shape with respect to an imaginary central axis. The imaginary central axis may be an axis passing a center between the first board connection pad CP-B1 and the second board connection pad CP-B2 spaced apart from each other along the first direction DR1 and may be the axis extending along the second direction DR2.

The first line L-b1 and the second line L-b2 may be spaced apart from each other along the first direction DR1. The first line L-b1 and the second line L-b2 may have a symmetrical shape with respect to the imaginary central axis. Accordingly, in such an embodiment, the differences in length and resistance between the first line L-b1 and the second line L-b2 may be minimized.

The test pattern TP may be symmetrical about the imaginary central axis. Since the test pattern TP has a symmetrical shape, the accuracy of the pad contact test using the test pattern TP may be improved.

The connection circuit board CF may further include a connection line for electrically connecting some lines to the test pattern. The connection line for electrically connecting the first line L-b1 to the test pattern TP may be defined as a first connection line CL1. The connection line for electrically connecting the second line L-b2 to the test pattern TP may be defined as a second connection line CL2.

The first connection line CL1 may be electrically connected to the first line L-b1 on the region overlapping the driving chip IC. The second connection line CL2 may be electrically connected to the second line L-b2 on the region overlapping the driving chip IC.

In an embodiment of the invention, among the board connection pads CP-B, a portion of the board connection pads electrically connected to the driving chip IC may be electrically connected to the test pattern TP. The bonding resistance of the pads electrically connected to the test pattern TP may be measured through the test pattern TP. By measuring the bonding resistance, it may be effectively checked whether or not the board connection pad and the board pad are sufficiently contacted and connected.

Conventionally, the degree of bonding was predicted through the pads disposed on the outer side among the board connection pads arranged along one direction to evaluate the contact state of the board connection pad. in this case, it may not be easy to evaluate specific pads disposed adjacent to the central part among the board connection pads arranged along one direction.

In an embodiment of the display device according to the invention, the degree of contact of the pads which electrically connect the main circuit board and the driving chip may be checked, and the contact of specific pads may be tested by specifically designating the pads that is desired to be tested and connecting the pads to the test pattern.

Hereinafter, various embodiments of the test pattern according to the invention will be described with reference to FIGS. 6A and 6B. The same or like elements shown in FIGS. 6A and 6B have been labeled with the same reference characters as used above to describe the embodiment of the test pattern described above, and any repetitive detailed description thereof will hereinafter be omitted or simplified.

Figure 6A:
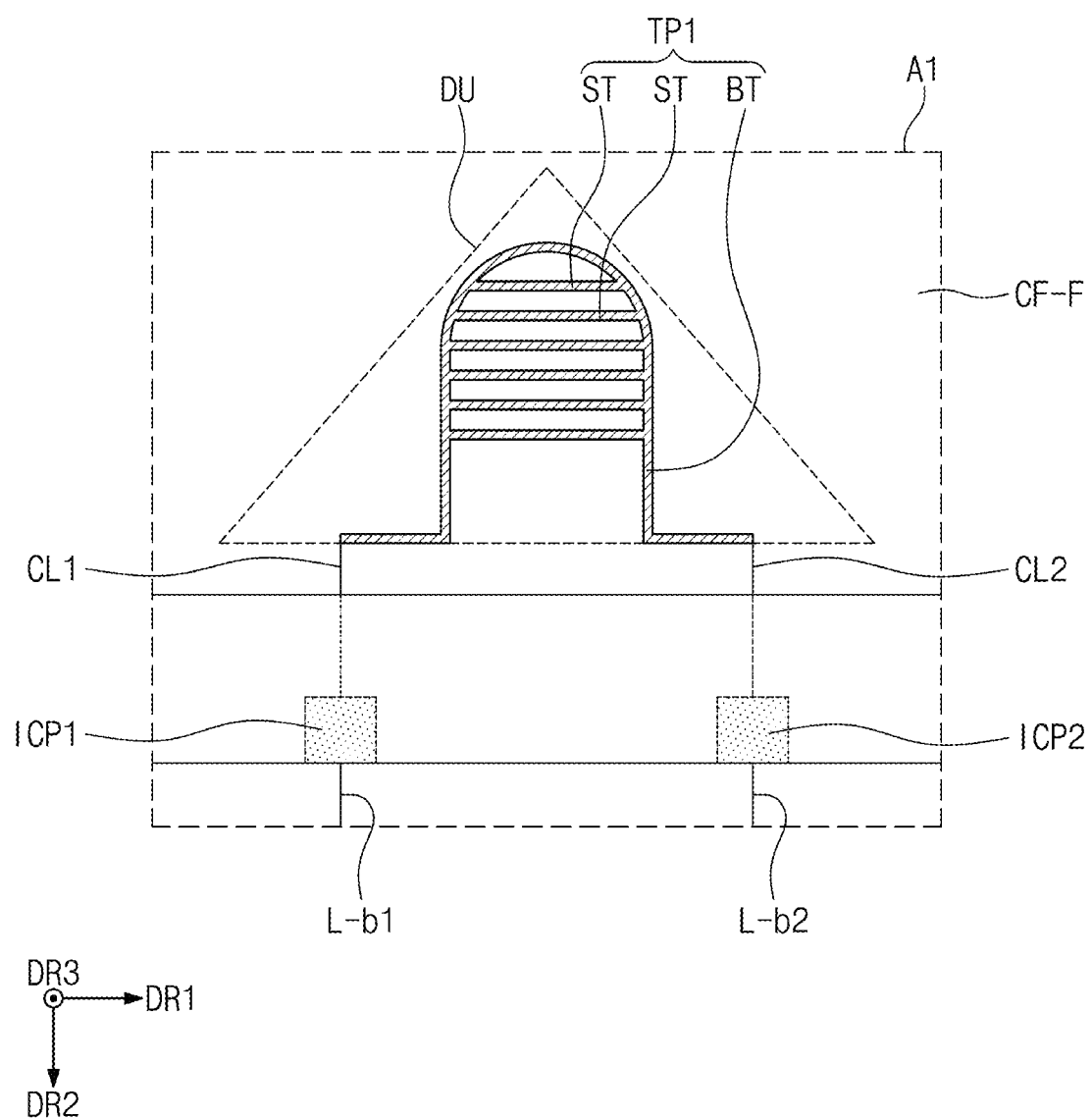
FIGS. 6A and 6B are enlarged plan views of test patterns according to an embodiment of the invention.
Figure 6B:
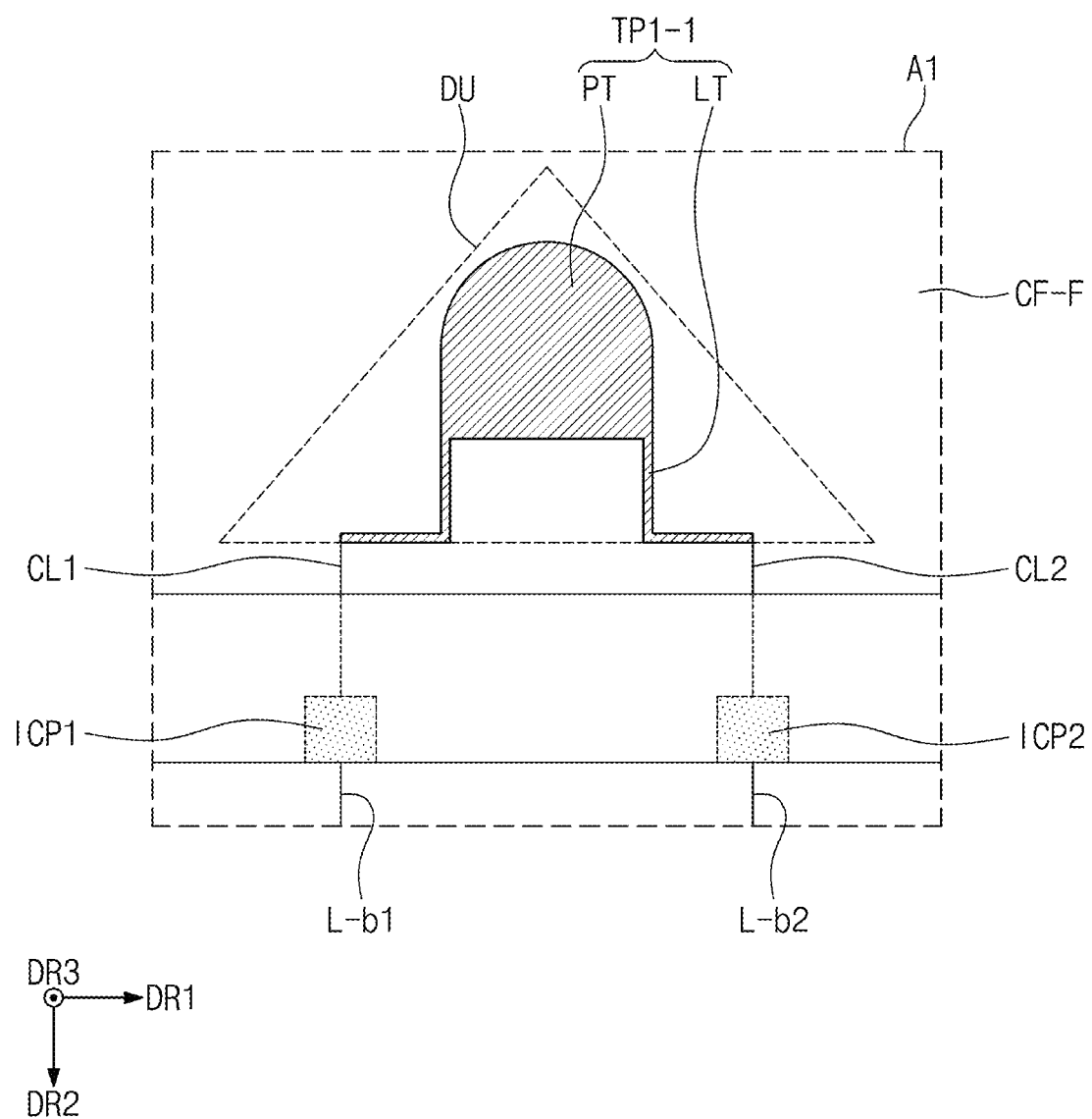

FIGS. 6A and 6B are enlarged plan views of an embodiment of a connection circuit board CF corresponding to some region A1 illustrated in FIG. 5. The connection circuit board CF illustrated in each of FIG. 6A and FIG. 6B shows an embodiment of first test patterns TP1 and TP1-1. The connection circuit board CF illustrated in each of FIG. 6A and FIG. 6B substantially includes a same configuration as each other, except for the shape of the first test patterns TP1 and TP1-1.

In an embodiment, the first test pattern TP1 or TP1-1 may electrically connect the first board connection pad CP-B1 and the second board connection pad CP-B2, respectively electrically connected to the first test pattern TP1 or TP1-1. By using the first test pattern TP1 or TP1-1, a total combined resistance of the bonding resistances of the first board connection pad CP-B1 and the second board connection pad CP-B2 may be measured. Hereinafter, the first test patterns TP1 or TP1-1 to be described with reference to FIGS. 6A and 6B may be referred to as a test pattern.

Referring to FIG. 6A, in an embodiment, the test pattern TP1 may include stripe patterns connected to each other. The test pattern TP1 may include the stripe patterns ST and a border pattern BT connected to the stripe patterns ST.

The stripe patterns ST may be the patterns of stripes arranged along one direction. In one embodiment, for example, the stripe patterns ST may be stripes extending in the first direction DR1 and arranged along the second direction DR2. However, without being limited thereto, the shape of the stripe patterns ST may vary depending on the direction of extension and arrangement of stripes. In one alternative embodiment, for example, the stripe patterns ST may be stripes extending in the second direction DR2 and arranged along the first direction DR1.

The widths of the stripe patterns ST defined in the first direction DR1 may be the same as each other. The stripe patterns ST may be a portion that comes into contact with a tip of a test device during the pad contact test process. Depending on the portion that comes into contact with the tip of the test device, measurement values may be affected. In an embodiment where the widths of the stripe patterns ST are the same as each other, the deviation in measurement values may be reduced, thus improving the accuracy of the pad contact test.

Since the test pattern TP1 includes stripe patterns ST rather than a single stripe, an area in which the test pattern TP1 comes into contact with the tip of the test device may be relatively widened. Since the test pattern TP1 and the tip are sufficiently contacted with each other, measurement values may be easily obtained.

The border pattern BT may be a pattern to which one ends and the other ends of stripe patterns ST opposite to each other in one direction are connected. The stripe patterns ST may be electrically connected through the border pattern BT.

The border pattern BT may be connected to the connection lines CL1 and CL2. When viewed in a plane, the border pattern BT may extend in one direction from one end of the pattern and then a portion thereof may be bent. When viewed in a plane, a portion of the border pattern BT may have a curved shape. FIG. 6A illustrates an embodiment where the border pattern BT in which lines extending in the first direction DR1 from both ends are bent in the second direction DR2 to form a U-like shape. Alternatively, the border pattern BT may have a linear shape, and the shape of the border pattern BT is not limited to a particular shape as long as the stripe patterns ST is allowed to be connected to each other.

Referring to FIG. 6B, in an alternative embodiment, the test pattern TP1-1 may include an integrated plate-shaped pattern. The test pattern TP1-1 may include a plate portion PT having an integrated plate shape and a line portion LT extending from the plate portion PT. The line portion LT may extend from the plate portion PT to the connecting lines CL1 and CL2 and may be electrically connected to the connection lines CL1 and CL2. Without being limited thereto, the connection lines CL1 and CL2 may be directly connected to the plate portion PT having the integrated plate shape. The shape of the plate portion PT is not limited to the shape illustrated in FIG. 6B. When viewed in a plane, the shape of the plate portion PT may be a circle or polygon such as a triangle or tetragon.

In such an embodiment, since the test pattern TP1-1 including an integrated plate-shaped pattern has a large area which comes into contact with the tip of the test device, measurement may be easily carried out. In such an embodiment where the test pattern TP1-1 is formed in an integrated plate shape, a thickness of the test pattern TP1-1 may be different from that of lines formed in a same layer as the test pattern TP1-1, which will hereinafter be described in detail with reference to FIGS. 7A to 7D.

Figure 7A:
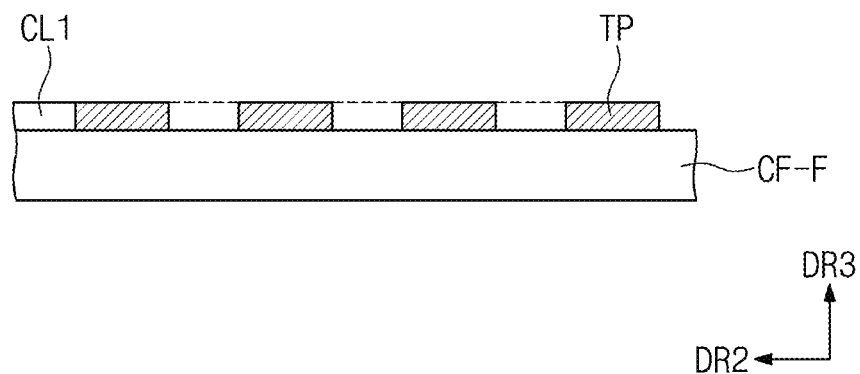
FIGS. 7A to 7D are cross-sectional views of a connection circuit board according to an embodiment of the invention.
Figure 7B:
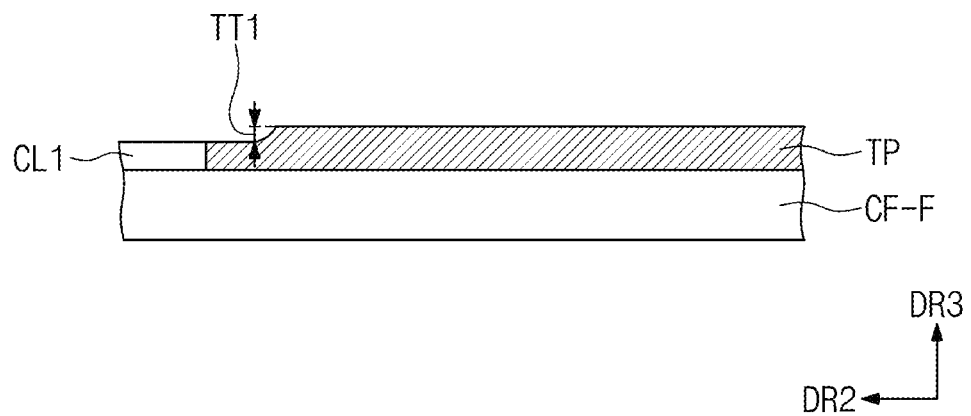
Figure 7C:
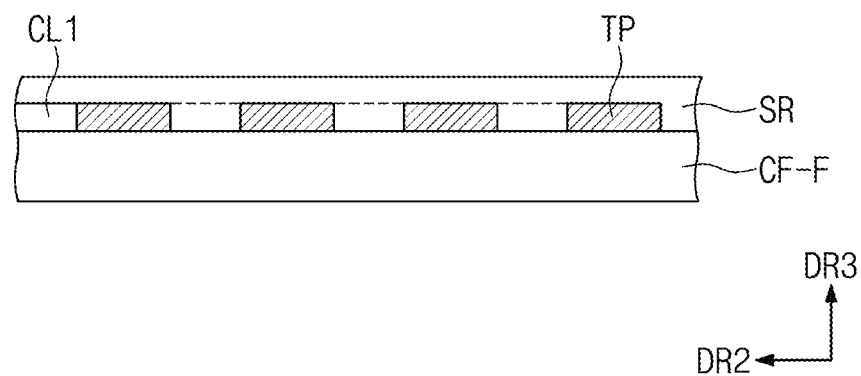
Figure 7D:
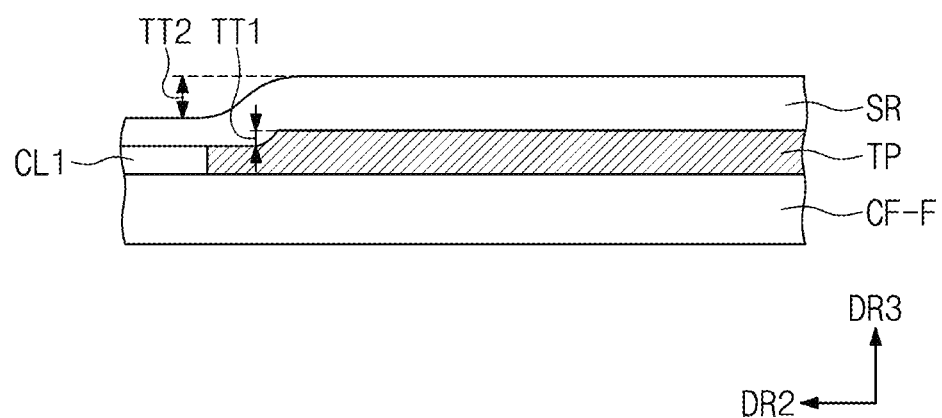

FIGS. 7A to 7D are partial cross-sectional views of a connection circuit board according to an embodiment of the invention. FIGS. 7A and 7C are partial cross-sectional views illustrating a test pattern TP including stripe patterns, and FIGS. 7B and 7D are partial cross-sectional views illustrating a test pattern TP-1 including a plate-shaped pattern.

The test patterns TP and TP-1 may be disposed on the base layer CF-F and formed on the same layer as a plurality of lines (e.g. the signal lines and the connection lines). In one embodiment, for example, the test patterns TP and TP-1 and the plurality of lines may be formed by depositing a composition and etching. FIGS. 7A to 7D illustrate an embodiment where the first connection line CL1 (hereinafter referred to the connection line CL1) is electrically connected to the test patterns TP and TP-1.

Referring to FIG. 7A, in an embodiment, a thickness of the test pattern TP including the stripe patterns may be substantially the same as that of the lines adjacent thereto. In one embodiment, for example, the thickness of the test pattern TP may be substantially the same as that of the connection line CL1. Herein, the term "substantially the same" implies being within the range of error of a process.

Referring to FIG. 7B, in an alternative embodiment, a thickness of the test pattern TP-1 including the plate-shaped pattern may have a step difference TT1 in some region. Therefore, the thickness of the test pattern TP-1 may be different from that of the lines adjacent thereto. In one embodiment, for example, the thickness of the test pattern TP-1 may have a step difference TT1 from that of the connection line CL1. FIG. 7B illustrates a cross-sectional view of an embodiment of the test pattern TP-1 having a step difference TT1, but not being limited thereto.

The plate-shaped pattern may have a relatively large area compared to the stripe patterns. In an etching process for forming a plate-shaped pattern, sufficient etching may not be achieved due to the limitation of the process, thus causing the step difference TT1 between the test pattern TP-1 and the lines adjacent thereto.

In an embodiment where the test pattern includes stripe patterns, the difference in thickness between the test pattern TP and the lines adjacent thereto may be minimized and the area that comes into contact with the tip of the test device may be sufficiently secured. In such an embodiment, in a cutting process to be described later as a pad contact test process, the test pattern TP may be easily cut.

Referring to FIGS. 7C and 7D, the connection circuit board CF may further include a protective film SR disposed on the test patterns TP and TP-1. FIG. 7C illustrates an embodiment of the connection circuit board CF in which the protective film SR is disposed on the test pattern TP illustrated in FIG. 7A, and FIG. 7D illustrates an embodiment of the connection circuit board CF in which the protective film SR is disposed on the test pattern TP-1 illustrated in FIG. 7B.

The protective film SR may be disposed to cover the lines and the test pattern TP on the base layer CF-F. The protective film SR may block foreign substances or moisture from entering into the lines and the test pattern TP and prevent corrosion thereof. The protective film SR may be a coating film or an insulation tape containing an insulation material, but the protective film SR is not particularly limited to any one embodiment as long as the lines and the test pattern TP is allowed be protected, Referring to FIG. 7C, an embodiment of the protective film SR may have a flat upper surface on the connection line CL1 and the test pattern TP. Without being limited thereto, as in an embodiment illustrated in FIG. 7D, the protective film SR may have a curved upper surface on the connection line CL1 and the test pattern TP-1. In one embodiment, for example, the protective film SR may have a step difference TT2 in thickness due to overlapping on a partial region in which the step difference TT1 of the test pattern TP-1 exists.

In an embodiment, the protective film SR may cover the lines and expose at least a portion of the test patterns TP and TP-1, but the embodiment of the invention is not limited to any one embodiment.

Figure 8:
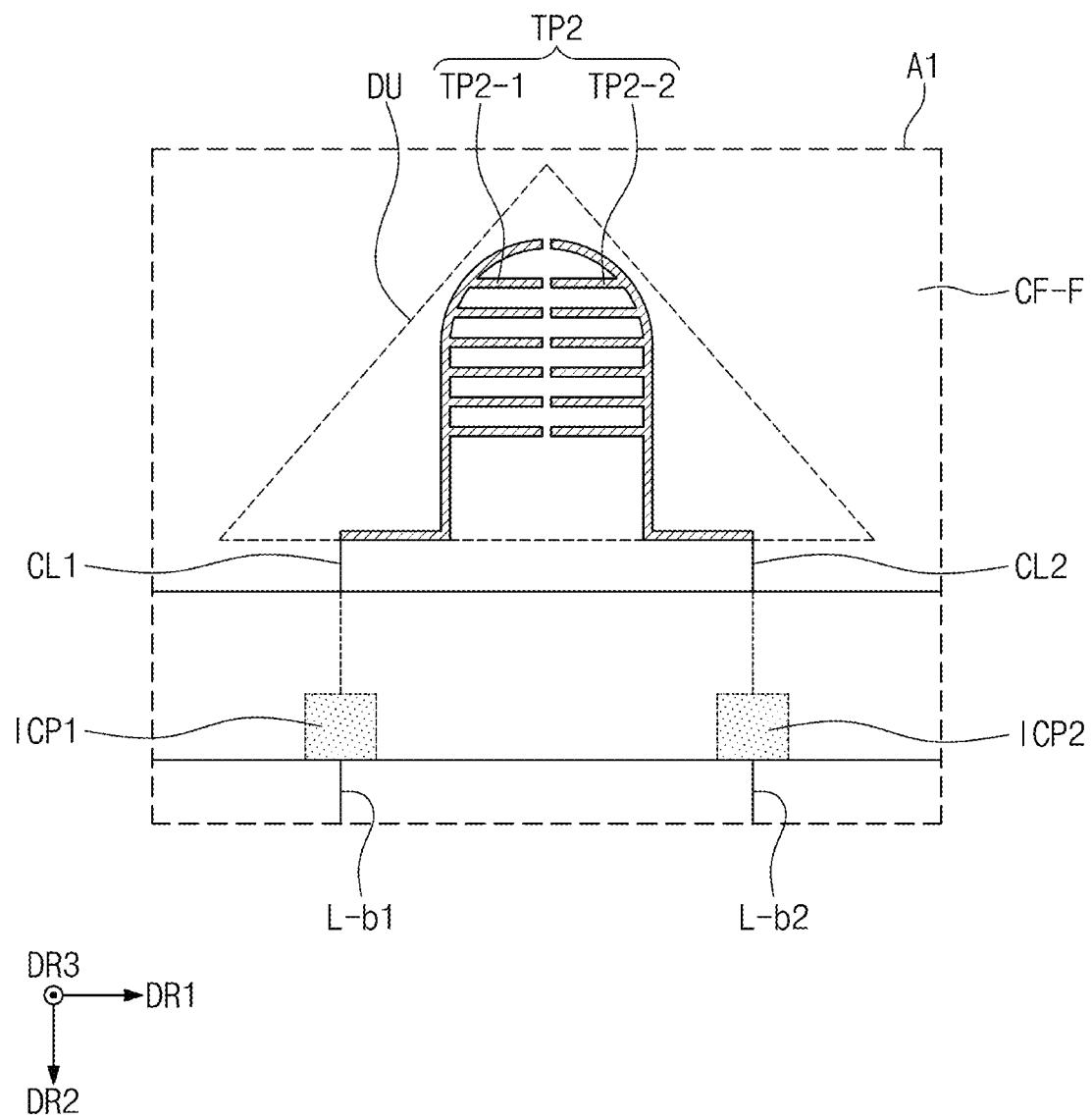
FIG. 8 is an enlarged plan view of a test pattern according to an embodiment of the invention.

FIG. 8 is an enlarged plan view of an embodiment of a connection circuit board corresponding to some region A1 illustrated in FIG. 5. The connection circuit board CF illustrated in FIG. 8 includes an embodiment of the second test pattern TP2.

The second test pattern TP2 may be formed by cutting off a portion of the first test pattern TP1 or TP1-1 (see FIGS. 6A and 6B) described above. Embodiments of the invention provide the test pattern capable of measuring or configured to measure the bonding resistance of each of the first board connection pad CP-B1 and the second board connection pad CP-B2 by adding a simple process such as cutting after measuring the combined resistance of the bonding resistances of the first board connection pad CP-B1 and the second board connection pad CP-B2. Hereinafter, the second test pattern TP2 to be described with reference to FIG. 8 may be referred to as a test pattern.

Referring to FIG. 8, the test pattern TP2 may include patterns spaced apart from each other due to cutting. The test pattern TP2 may include a first pattern TP2-1 and a second pattern TP2-2 spaced apart from each other. The first pattern TP2-1 and the second pattern TP2-2 may be insulated from each other by being spaced apart from each other.

The first pattern TP2-1 may be electrically connected to the first line L-b1 and the first board connection pad CP-B1. The second pattern TP2-2 may be electrically connected to the second line L-b2 and the second board connection pad CP-B2. Since the first pattern TP2-1 and the second pattern TP2-2 are insulated from each other, the first line L-b1 and the second line L-b2 may also be insulated from each other.

Since the test pattern TP2 includes the first and second patterns TP2-1 and TP2-2 insulated from each other, the bonding resistance of the board connection pad electrically connected to one of the patterns may be separately measured. By using the first pattern TP2-1, it may be measured the bonding resistance of the first board connection pad CP-B1 electrically connected to the first pattern TP2-1. By using the second pattern TP2-2, it may be measured the bonding resistance of the second board connection pad CP-B2 electrically connected to the second pattern TP2-2. By checking a degree of contact of a specific board connection pad through the bonding resistance of, a degree of contact of board connection pads disposed adjacent thereto may be predicted.

In an embodiment, when the area of the tip of the test device is large, measurement may be carried out in a state in which the tip comes into contact with all of the first pattern TP2-1 and the second pattern TP2-2, such that a measurement value may be distorted. in an embodiment, the connection circuit board CF may further include sub-test patterns to compensate for such distortion, which will be described later in detail.

Figure 9:
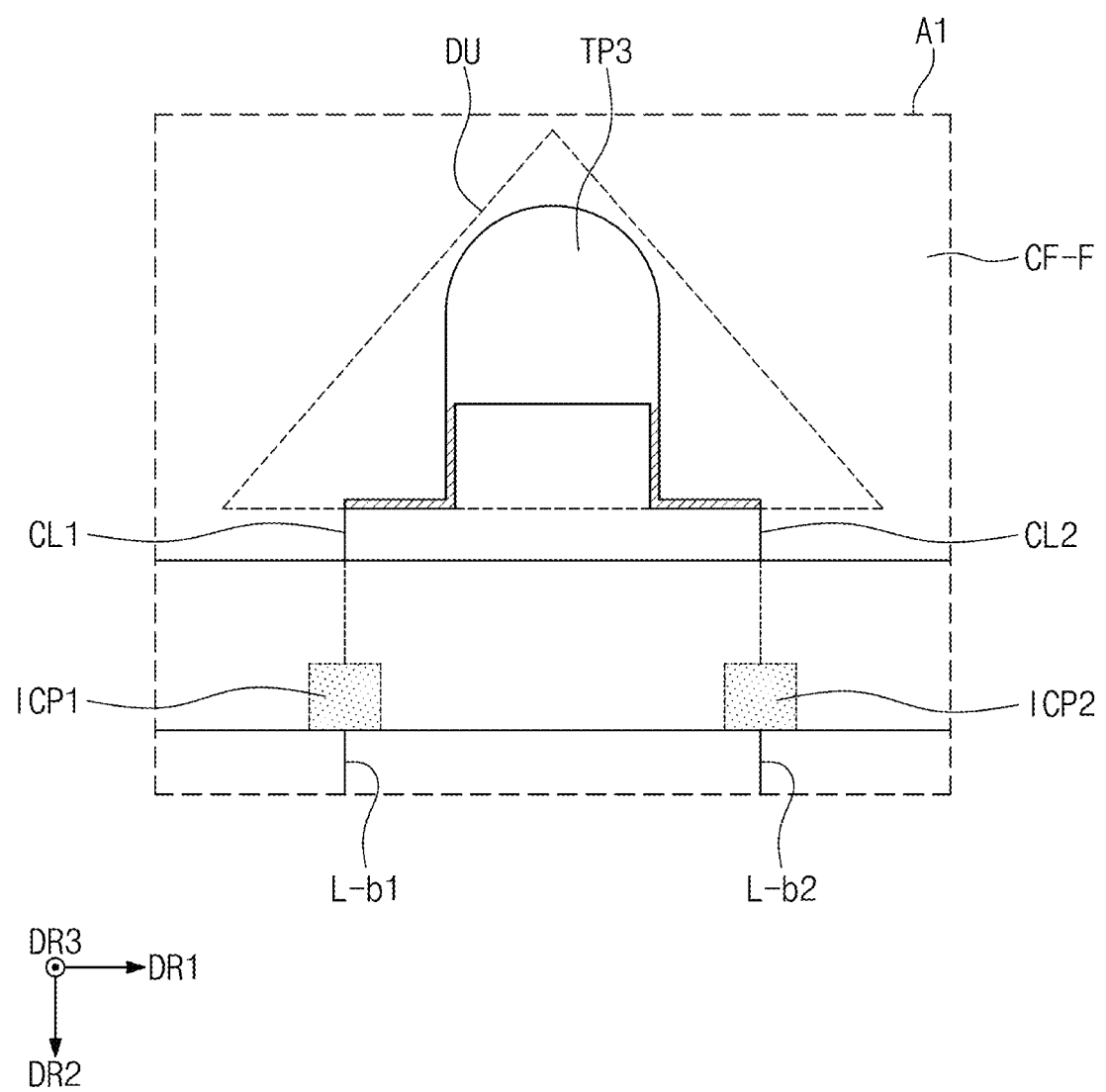
FIG. 9 is an enlarged plan view of the test pattern according to an embodiment of the invention.

FIG. 9 is an enlarged plan view of an embodiment of the connection circuit board CF corresponding to some region A1 illustrated in FIG. 5. The connection circuit board CF illustrated in FIG. 9 includes an embodiment of the third test pattern TP3.

The third test pattern TP3 may be formed by bonding an insulated portion of the second test pattern TP2. The third test pattern TP3 may electrically connect the board connection pads each of which is electrically connected to the third test pattern TP3. Hereinafter, the third test pattern TP3 to be described with reference to FIG. 9 may be referred to as a test pattern.

The test pattern may further include a metal film. The metal film may be a film which covers the stripe patterns ST (see FIG. 6A) or the plate-shaped pattern PT (see FIG. 6B) described above. The metal film may be a film which covers the first pattern TP2-1 and the second pattern TP2-2 described with reference to FIG. 8. On a plane, the test pattern TP3 may have an integrated plate shape.

The metal film may include a material different from that of the lines L-b1 and L-b2. In one embodiment, for example, the lines L-b1 and L-b2 may include copper, and the metal film may include lead. However, the material of the metal film is not limited thereto.

The metal film may include a material different from that of the patterns included in the test pattern TP3. In one embodiment, for example, the patterns of the test pattern TP3 may include copper and the metal film of the test pattern TP3 may include lead. However, the embodiment of the test pattern TP3 is not limited thereto.

The test pattern TP3 may electrically connect the first line L-b1 and the second line L-b2. Due to an error of a manufacture process, the bonding resistances of the first board connection pad CP-B1 and the second board connection pad CP-B2 may be different from each other. However, by electrically connecting the first line L-b1 and the second line L-b2 for transmitting a same signal as each other, a deviation in current and voltage between the first and second lines L-b1 and L-b2, which may be caused by the difference in bonding resistance between the first board connection pad CP-B1 and the second board connection pad CP-B2, may be eliminated. Due to the elimination of the deviation in current and voltage, a distortion of a signal transmitted through the lines may be effectively prevented.

Figure 10:
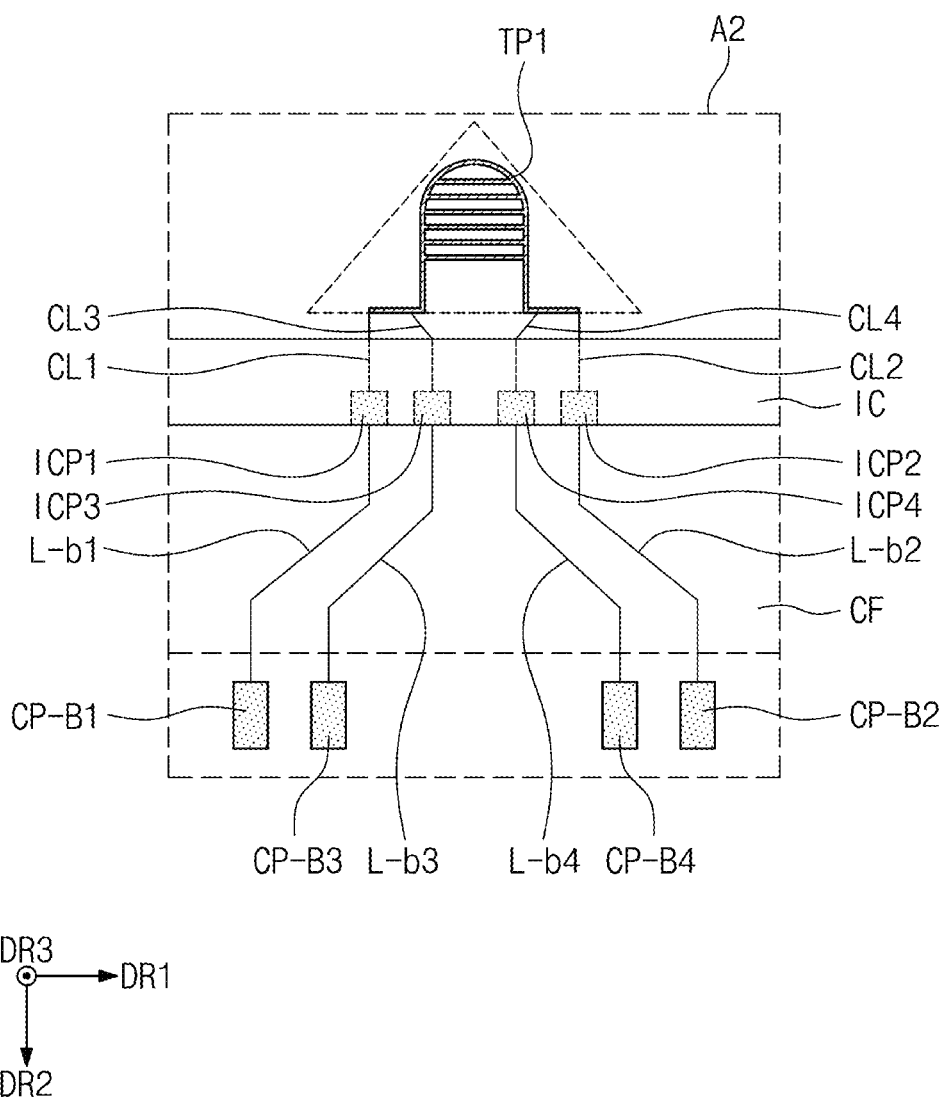
FIG. 10 is an enlarged plan view of the connection circuit board according to an embodiment of the invention.

FIG. 10 is an enlarged plan view of an embodiment of the connection circuit board CF corresponding to some region A2 illustrated in FIG. 5. An embodiment of the connection circuit board CF illustrated in FIG. 10 includes a substantially same configuration as that of the embodiment of the connection circuit boards described above, except for configurations electrically connected to the test pattern TP1. The same or like elements shown in FIG. 10 have been labeled with the same reference characters as used above to describe the embodiment of the connection circuit board CF described above, and any repetitive detailed description thereof will hereinafter be omitted or simplified.

Among a plurality of board connection pads CP-B, a third board connection pad CP-B3 and a fourth board connection pad CP-B4 may be pads which receive a same signal from the main circuit board MB. Each of the third board connection pad CP-B3 and the fourth board connection pad CP-B4 may receive an electrical signal which is different from a signal transmitted from the main circuit board MB to the first board connection pad CP-B1 and the second board connection pad CP-B2.

A line for electrically connecting the third board connection pad CP-B3 and the driving chip IC may be defined as a third line L-b3. A line for electrically connecting the fourth board connection pad CP-B4 and the driving chip IC may be defined as a fourth line L-b4. Each of the third line L-b3 and the fourth line L-b4 may receive a same voltage from the main circuit board MB.

Each of the first line L-b1 and the second line L-b2 may receive a first voltage from the main circuit board MB, and each of the third line L-b3 and the fourth line L-b4 may receive a second voltage from the main circuit board MB. The first voltage and the second voltage may be different from each other.

A line resistance of the third line L-b3 and a line resistance of the fourth line L-b4 may be the same as each other. In one embodiment, for example, lengths and cross-sectional areas of the third line L-b3 and the fourth line L-b4 may be the same as each other and materials included the third line L-b3 and the fourth line L-b4 may be the same as each other. The first to fourth lines L-b1, L-b2, L-b3, and L-b4 may be formed through a same process and in a same layer.

The third line L-b3 may be electrically connected to the driving chip IC through a third driving pad ICP3. The fourth line L-b4 may be electrically connected to the driving chip IC through a fourth driving pad ICP4. The third line L-b3 and the fourth line L-b4 may transmit to the driving chip IC a same signal received from the main circuit board MB.

The third board connection pad CP-B3 may be electrically connected to the test pattern TP1 through the third line L-b3 and a third connection line CL3, and the fourth board connection pad CP-B4 may be electrically connected to the test pattern TP1 through the fourth line L-b4 and a fourth connection line CL4. The third board connection pad CP-B3 and the fourth board connection pad CP-B4 may be electrically connected by the test pattern TP1. By inputting a test signal to the first board connection pad CP-B1 and the second board connection pad CP-B2, the combined resistance of the bonding resistances of the first board connection pad CP-B1 and the second board connection pad CP-B2 may be measured through the test pattern TP1. Thereafter, by inputting a test signal to the third board connection pad CP-B3 and the fourth board connection pad CP-B4, the combined resistance of the bonding resistances of the third board connection pad CP-B3 and the fourth board connection pad CP-B4 may be measured through the test pattern TP1.

An embodiment of the connection circuit board CF according to the invention may measure the bonding resistance of the pads which receive different signals from each other from the main circuit board MB through a same test pattern TP1. In such an embodiment, the degree of contact of many pads may be checked with one test pattern TP1. After completion of a test, a portion of the test pattern TP1 may be cut off so that the board connection pads for receiving different signals are not electrically connected to each other through the test pattern.

Figure 11A:
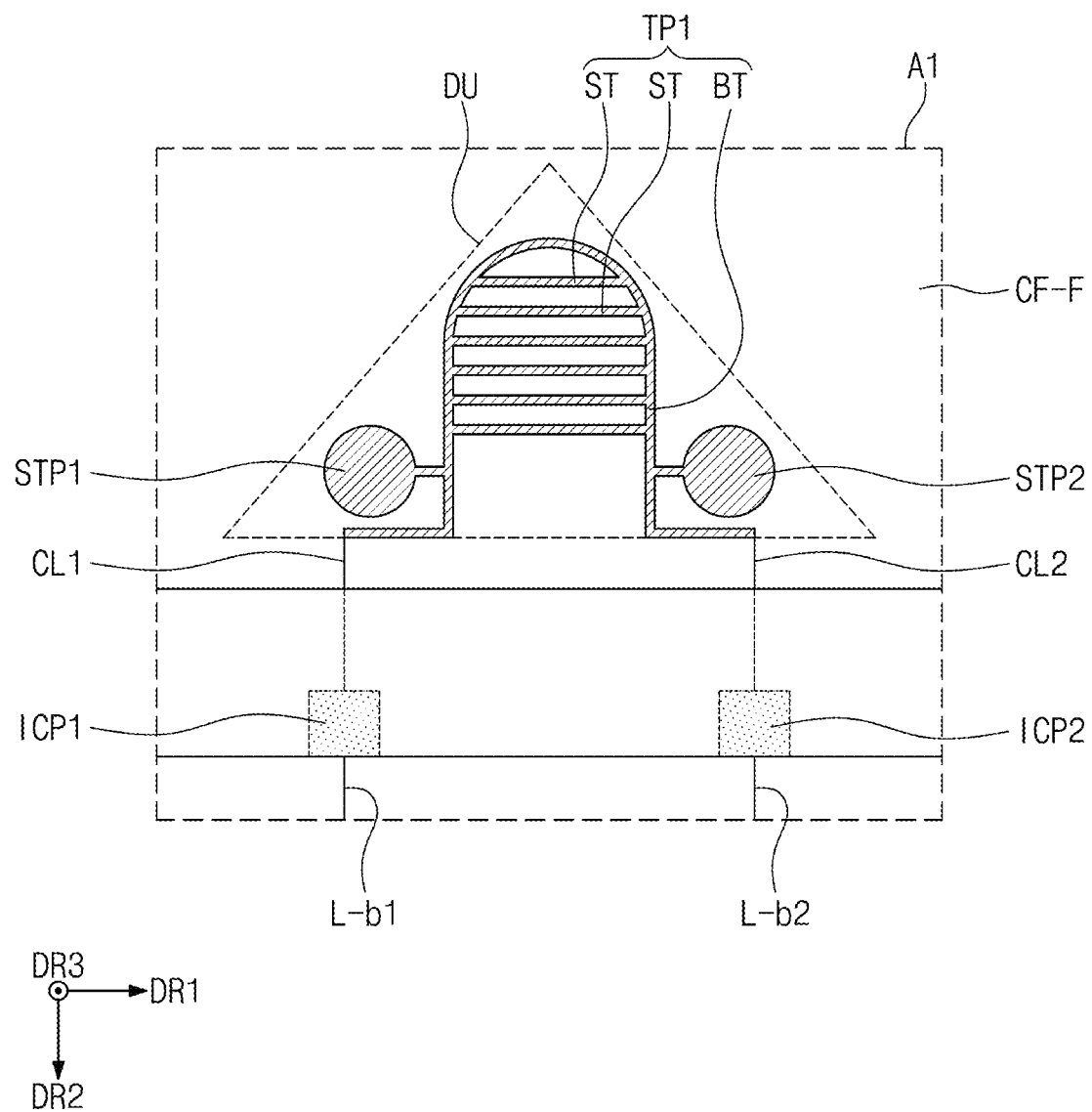
FIGS. 11A and 11B are enlarged plan views of the test patterns according to an embodiment of the invention.
Figure 11B:
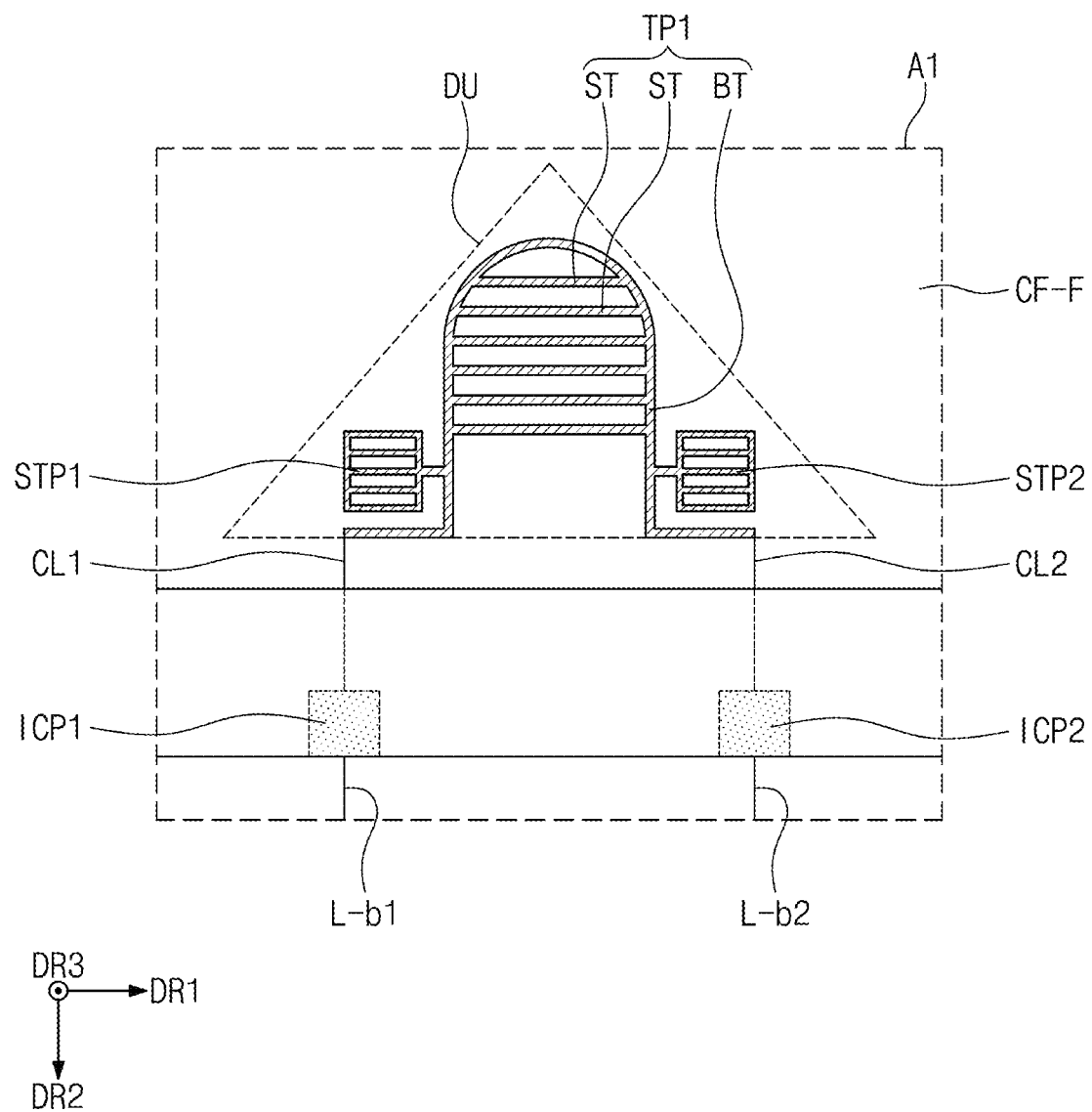

FIGS. 11A and 11B are enlarged plan views of embodiments of the connection circuit boards CF, which correspond to some region A1 illustrated in FIG. 5. An embodiment of the connection circuit board CF illustrated in FIGS. 11A and 11B includes a substantially same configuration as that of the embodiment of the connection circuit boards described above except that sub-test patterns are further included.

FIGS. 11A and 11B illustrate embodiments of the connection circuit board CF including the test pattern TP1 described with reference to FIG. 6A. The same or like elements shown in FIGS. 11A and 11B have been labeled with the same reference characters as used above to describe the embodiment of the connection circuit board CF described above, and any repetitive detailed description thereof will hereinafter be omitted or simplified.

Referring to FIGS. 11A and 11B, an embodiment of the connection circuit board CF may further include a first sub-test pattern STP1 and a second sub-test pattern STP2. Each of the first sub-test pattern STP1 and the second sub-test pattern STP2 may be electrically connected to the test pattern TP1.

The first sub-test pattern STP1 and the second sub-test pattern STP2 may include a same material as each other. Each of the first sub-test pattern STP1 and the second sub-test pattern STP2 may include the same material as the test pattern TP1. Each of the first sub-test pattern STP1 and the second sub-test pattern STP2 may include the same material as the lines of the connection circuit board CF.

The first sub-test pattern STP1 and the second sub-test pattern STP2 may be formed in a same layer through a same process as the test pattern TP1. The first sub-test pattern STP1 and the second sub-test pattern STP2 may be formed in a same layer through a same process as the lines.

A resistance value of the first sub-test pattern STP1 and a resistance value of the second sub-test pattern STP2 may be the same as each other. When viewed in a plane, an area of the first sub-test pattern STP1 and an area of the second sub-test pattern STP2 may be the same as each other. Accordingly, the accuracy of the test for measuring the bonding resistance of each of the board connection pads may be improved.

When viewed in a plane, the sub-test patterns STP1 and STP2 may be spaced apart from a portion of the test pattern TP1 which comes into contact with the tip of the test device when measuring a combined resistance. In one embodiment, for example, the test pattern TP1 may include stripe patterns ST and a border pattern BT. The sub-test patterns STP1 and STP2 may be connected to the border pattern BT and spaced apart from the stripe patterns ST, such that the bonding resistance of the board connection pad electrically connected to the sub-test pattern may be easily measured.

When viewed in a plane, the first sub-test pattern STP1 and the second sub-test pattern STP2 may be spaced apart from each other with the test pattern TP1 interposed therebetween. The first sub-test pattern STP1, the second sub-test pattern STP2, and the test pattern TP1 may be symmetrically shaped with respect to an imaginary central axis.

After cutting the first test pattern TP1 described above, the first sub-test pattern STP1 and the second sub-test pattern STP2 may be sub-patterns for improving the accuracy of a test in the process of measuring each of the bonding resistances of the first board connection pad CP-B1 and the second board connection pad CP-B2.

When viewed in a plane, each of area of the first sub-test patterns STP1 and the second sub-test patterns STP2 may be smaller than that of the test pattern TP1. Alternatively, without being limited thereto, the areas may be the same as each other.

Embodiments of the connection circuit boards CF illustrated in FIGS. 11A and 11B include a substantially same configuration as each other, except for the shape of the sub-test patterns.

Referring to FIG. 11A, in an embodiment, each of the first sub-test pattern STP1 and the second sub-test pattern STP2 may have an integrated plate shape. Each of the first sub-test pattern STP1 and the second sub-test pattern STP2 may include a plate portion having plate shape and a line portion extending from the plate portion and connected to the test pattern TP1.

FIG. 11A illustrates an embodiment where the first and second sub-test patterns STP1 and STP2 having circle shape when viewed in a plane, but the shape of the sub-test pattern is not limited thereto and alternatively, may be a polygonal shape such as a triangle or tetragon. In such an embodiment where the sub-test patterns STP1 and STP2 have an integrated plate shape, an area in contact with the tip of the test device may be increased.

Referring to FIG. 11B, in an alternative embodiment, each of the first sub-test pattern STP1 and the second sub-test pattern STP2 may include stripe patterns connected to each other. In one embodiment, for example, the stripes extending in the first direction DR1 may be arranged in the second direction DR2, and one ends and the other ends of the stripes may be connected to the stripes extending in the second direction DR2. However, the shape of the stripe patterns is not limited thereto and alternatively, may include a curve in a plan view. The description on the stripe patterns included in the test pattern TP1 may be equally applied to the description on the stripe patterns included in the first sub-test pattern STP1 and the second sub-test pattern STP2.

When viewed in a plane, the area of the stripe patterns included in the test pattern TP may be different from that of the stripe patterns included in each of the first sub-test pattern STP1 and the second sub-test pattern STP2. However, the embodiment of the invention is not limited thereto.

Figure 12A:
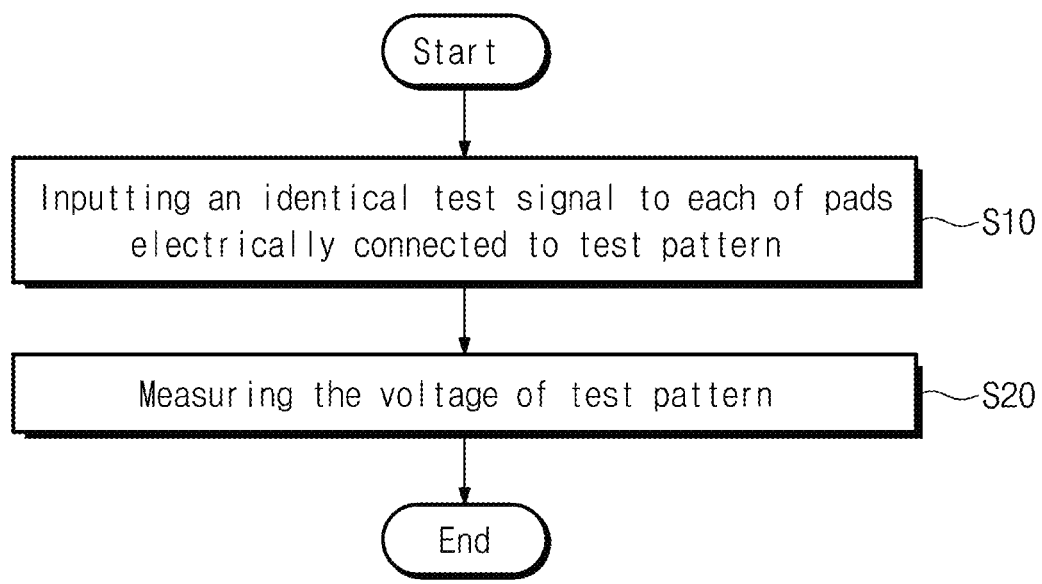
FIGS. 12A and 12B are flow charts of a method for testing the contact of pads of the display device according to an embodiment of the invention.
Figure 12B:
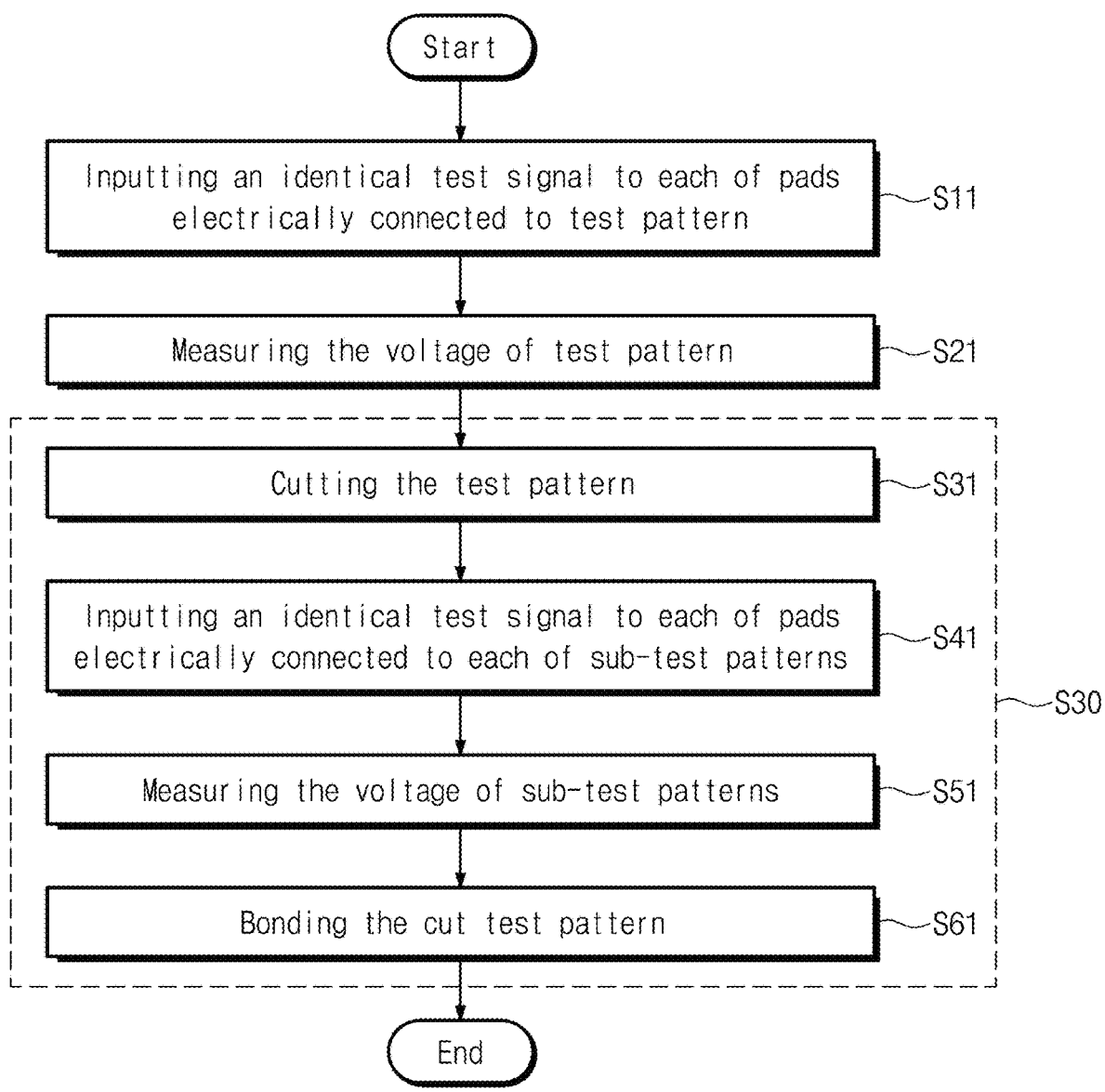

FIGS. 12A and 12B are flow charts of a method for testing the contact of pads of the display device according to an embodiment of the invention.

Referring to FIG. 12A, an embodiment of the method for testing the contact of the pads of the display device according to the invention may include inputting a same test signal to each of the pads electrically connected to the test pattern (S10) and measuring the voltage of the test pattern (S20). In such an embodiment, the overall degree of contact of the pads electrically connected to each other through the test pattern may be tested.

Referring to FIG. 12B, an embodiment of the method for testing the contact of the pads of the display device according to the invention may include inputting a same test signal to each of the pads electrically connected to the test pattern (S11) and measuring the voltage of the test pattern (S21). In such an embodiment, the method may further include, after the measuring (S21), an additional process (S30) is performed. In such an embodiment, the additional process (S30) may include cutting the test pattern (S31), inputting a same test signal to each of the pads electrically connected to each of the sub-test patterns (S41), measuring the voltage of the sub-test patterns (S51), and bonding the cut test pattern (S61).

By further including the additional test process (S30) after testing the overall degree of contact of the electrically connected pads, the degree of contact of each of the pads may be checked.

FIGS. 13A to 13D are enlarged plan views illustrating a process of a method for testing the contact of the pads of the display device according to an embodiment of the invention. FIGS. 13A to 13D illustrate a process of testing the contact of the pads of the display device having an embodiment of the flexible circuit board CF illustrated in FIG. 11A, and such a process may be equally applied to other embodiments.

Referring to FIGS. 13A to 13D, the first board connection pad CP-B1 may be connected to a first board pad MP1, and the second board connection pad CP-B2 may be connected to a second board pad MP2.

For the convenience of description, although the board connection pad CP-B and the board pad MP are illustrated as being misaligned, the board connection pad CP-B and the board pad MP may be substantially aligned or overlap each other.

The degree of contact between the pads may be checked by measuring the bonding resistance between the pads. The bonding resistance between the first board pad MP1 and the first board connection pad CP-B1 may be defined as a first bonding resistance, and the bonding resistance between the second board pad MP2 and the second board connection pad CP-B2 may be defined as a second bonding resistance.

The test pattern TP may include a first test pattern TP1, a second test pattern TP2, and a third test pattern TP3 in accordance with the test process. The first test pattern TP1 may be used to measure the combined resistance of the bonding resistances of the pads. The second test pattern TP2 may be used to measure the bonding resistance of each of the pads. The third test pattern TP3 may be a test pattern after completion of a pad contact test, but not being limited thereto. Alternatively, the first test pattern TP1 may be a test pattern after completion of the test according to the process of the pad contact test.

Figure 13A:
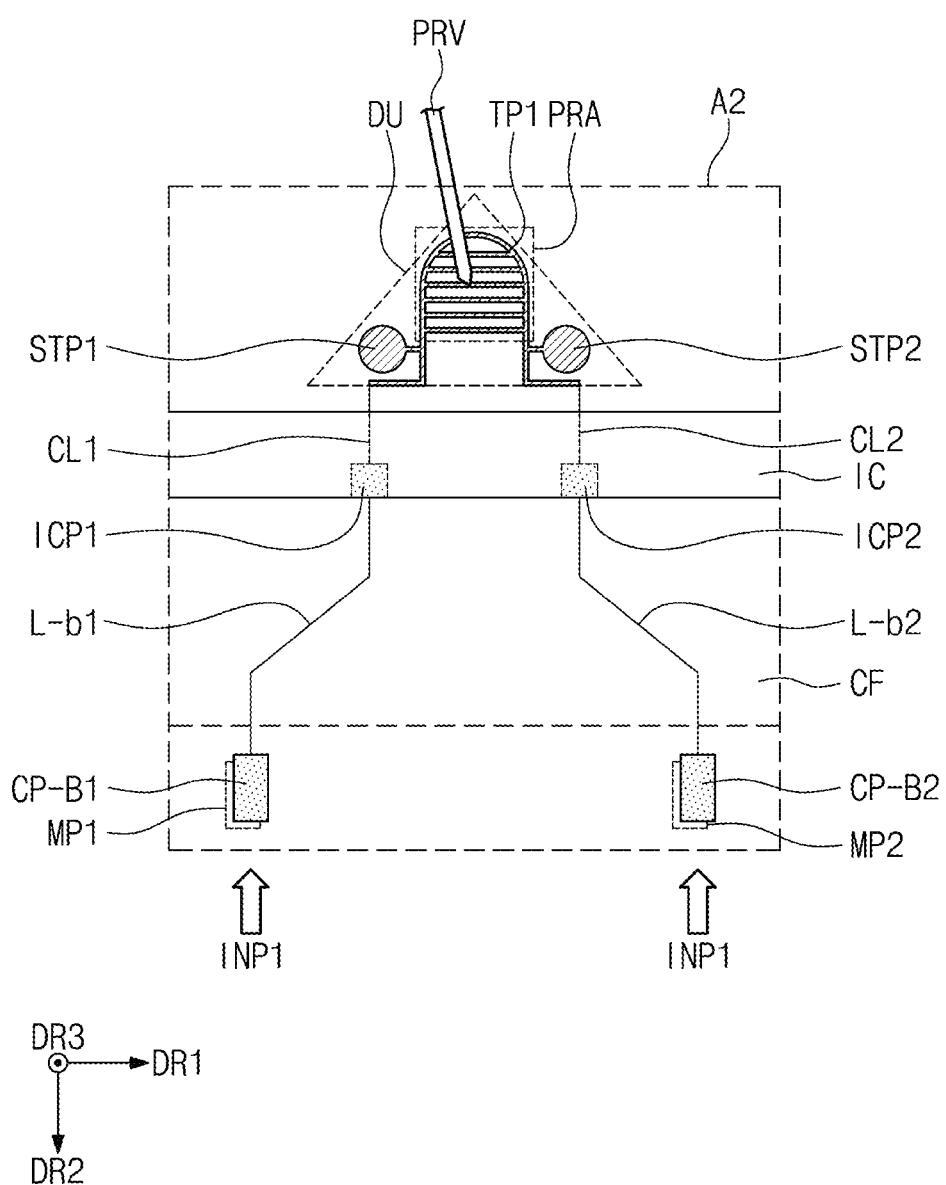
FIGS. 13A to 13D are plan views illustrating a process of a method for testing the contact of the pads of the display device according to an embodiment of the invention.

FIG. 13A is a plan view illustrating a step in which the combined resistance of the bonding resistances of the pads is measured. Referring to FIG. 13A, an embodiment of the connection circuit board CF includes the first test pattern TP1. The first test pattern TP1 is electrically connected to each of the first board connection pad CP-B1 and the second board connection pad CP-B2.

A same test signal INP1 is input to each of the first board connection pad CP-B1 and the second board connection pad CP-B2 through the main circuit board MB. The test signals INP1 received from the main circuit board MB may be respectively transmitted to the first board connection pad CP-B1 through the first board pad MP1 and to the second board connection pad CP-B2 through the second board pad MP2.

The test signal INP1 transmitted to the first board connection pad CP-B1 may be transmitted to the first test pattern TP1 through the first line L-b1 and the first connection line CL1. The test signal INP1 transmitted to the second board connection pad CP-B2 may be transmitted to the first test pattern TP1 through the second line L-b2 and the second connection line CL2.

In such an embodiment, a voltage applied to the first test pattern TP1 may be measured by contacting the tip PRV of the test device to the test region PRA on the first test pattern TP1 to test the degree of pad contact. Since the first test pattern TP1 is electrically connected to the first board connection pad CP-B1 and the second board connection pad CP-B2, the combined resistance of the first bonding resistance and the second bonding resistance may be measured by measuring a voltage applied to the first test pattern TP1.

By measuring the combined resistance, the overall degree of contact of the first board connection pad CP-B1 and the second board connection pad CP-B2 may be checked. Accordingly, an embodiment of the pad contact test method of the invention may check the degree of contact of specific pads for transmitting a same signal among the pads which transmit a signal from the main circuit board to the driving chip.

The combined resistance measured through the first test pattern TP1 may be different from a predicted value by more than an error range. However, when one of the first board connection pad CP-B1 and the second board connection pad CP-B2 is insufficiently connected, it may not be effectively evaluated which board connection pad is insufficiently connected by measuring the combined resistance. An embodiment of the method of testing the contact of the pads of the display device according to the invention allows to check which pad is insufficiently bonded by further including an additional test process (S30).

Figure 13B:
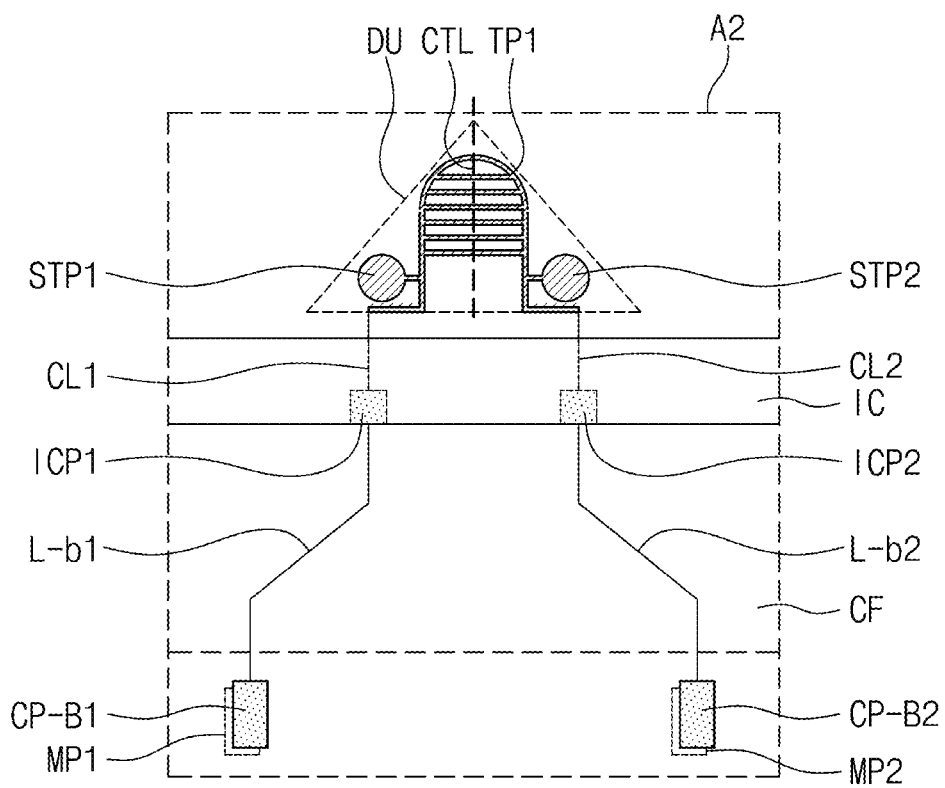

FIG. 13B is a plan view illustrating a process for the additional test process (S30). Referring to FIG. 13B, after measuring the voltage of the first test pattern TP1, a cutting line CTL may be set to insulate the first board connection pad CP-B1 and the second board connection pad CP-B2 electrically connected to each other through the first test pattern TP1.

After setting the cutting line CTL, the first test pattern TP1 may be cut along the cutting line CTL. The first board connection pad CP-B1 and the second board connection pad CP-B2 may be insulated from each other by cutting. Hereinafter, the cut first test pattern may be referred to as the second test pattern TP2.

Figure 13C:
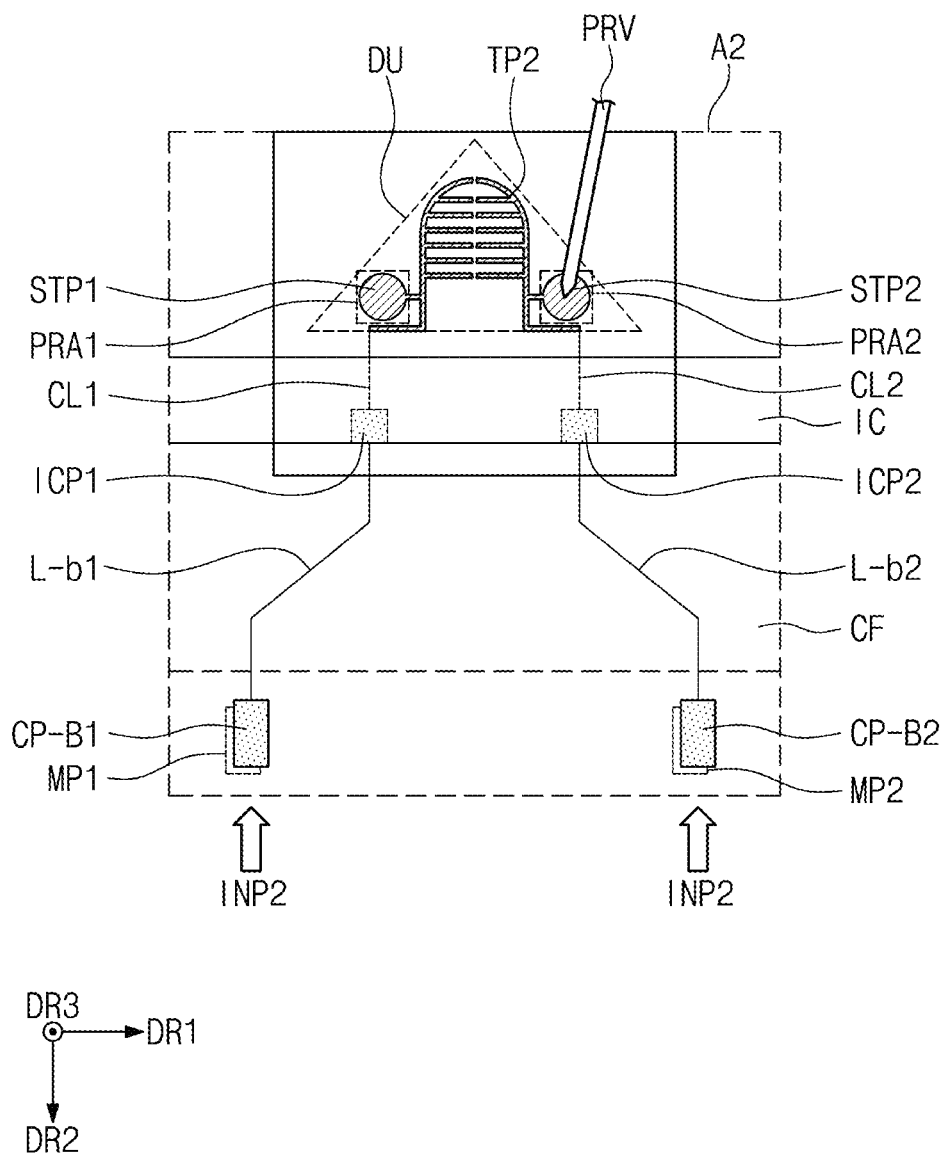

FIG. 13C is a plan view illustrating a process in which the bonding resistance of each of the pads is measured. Referring to FIG. 13C, the second test pattern TP2 may be cut along the cutting line CTL and a portion thereof may be spaced apart therefrom. In such an embodiment, the second test pattern TP2 may be substantially the same as the test pattern TP2 described above with reference to FIG. 8.

One part of the second test pattern TP2 (e.g. the first pattern TP2-1 of FIG. 8) may be electrically connected to the first sub-test pattern STP1 and the other part of the second test pattern TP2 (e.g. the second pattern TP2-2 of FIG. 8)

may be electrically connected to the second sub-test pattern STP2. The first sub-test pattern STP1 and the second sub-test pattern STP2 may be spaced apart from each other with the cutting line interposed therebetween. Accordingly, board connection pads electrically connected to each of the sub-test patterns STP1 and STP2 may be different.

The first board connection pad CP-B1 may be electrically connected to the first sub-test pattern STP1. The second board connection pad CP-B2 may be electrically connected to the second sub-test pattern STP2.

In such an embodiment, a same test signal INP2 is input to each of the first board connection pad CP-B1 and the second board connection pad CP-B2 through the main circuit board MB to measure the bonding resistances of the board connection pads. The test signal INP2 transmitted from the main circuit board MB may be transmitted to the first board connection pad CP-B1 through the first board pad MP1 and to the second board connection pad CP-B2 through the second board pad MP2.

The test signal INP2 transmitted to the first board connection pad CP-B1 may be transmitted to the first sub-test pattern STP1 through the first line L-b1 and the first connection line CL1. The test signal INP2 transmitted to the second board connection pad CP-B2 may be transmitted to the second sub-test pattern STP2 through the second line L-b2 and the second connection line CL2.

One part of the second test pattern TP2 connected to the first sub-test pattern STP1 and the other part of the second test pattern TP2 connected to the second sub-test pattern STP2 may not be electrically connected to each other.

By contacting the tip PRV of the test device to the test region PRA1 on the first sub-test pattern STP1, a voltage applied to the first sub-test pattern STP1 may be measured. By measuring the voltage of the first sub-test pattern STP1, the first bonding resistance may be measured. Through the first bonding resistance, the degree of contact between the first board connection pad CP-B1 and the first board pad MP1 may be checked.

In such an embodiment, by contacting the tip PRV of the test device to the test region PRA2 on the second sub-test pattern STP2, a voltage applied to the second sub-test pattern STP2 may be measured. By measuring the voltage of the second sub-test pattern STP2, the second bonding resistance may be measured. Through the second bonding resistance, the degree of contact between the second board connection pad CP-B2 and the second board pad MP2 may be checked.

By measuring each bonding resistance, it may be checked which one of the first board connection pad CP-B1 and the second board connection pad CP-B2 is insufficiently connected. By checking the degree of contact of the board connection pads, the degree of contact of the pads adjacent to the board connection pads to be tested may be effectively predicted.

Figure 13D:
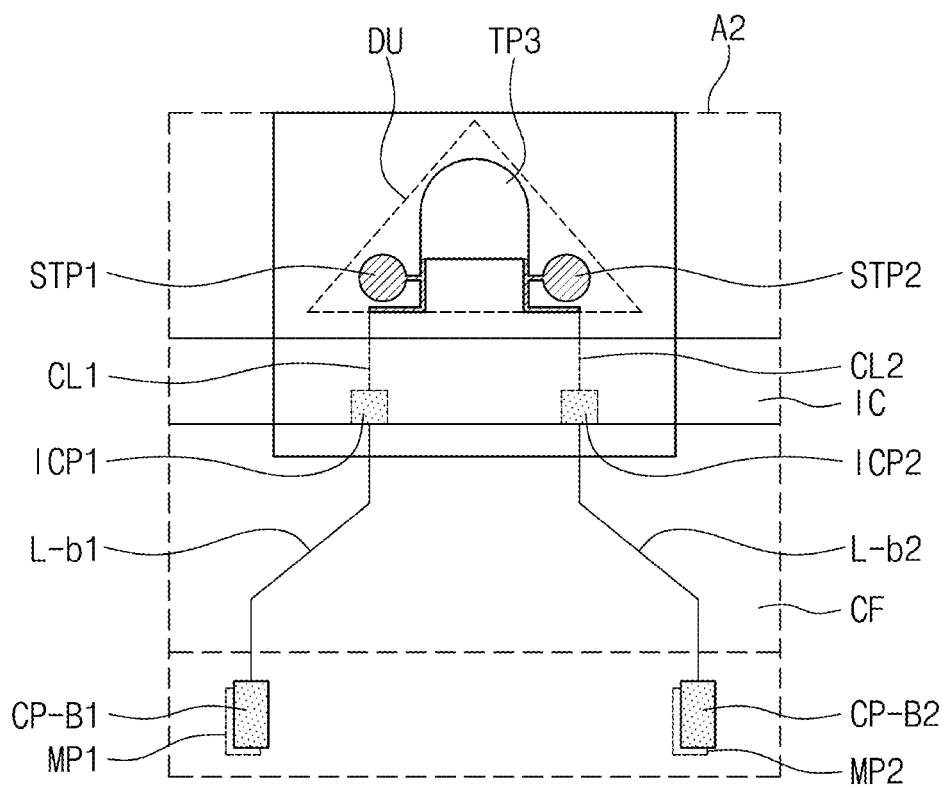

FIG. 13D is a plan view illustrating a process of bonding the cut second test pattern TP2 after completion of the pad contact test. The third test pattern TP3 may be a pattern to which an insulated portion of the second test pattern TP2 is electrically connected again.

Referring to FIG. 13D, the insulated portion of the second test pattern TP2 may be electrically connected again by covering, with a metal film, the cut portion of the second test pattern TP2. In one embodiment, for example, the insulated portion of the second test pattern TP2 may be bonded by using lead, and the third test pattern TP3 may correspond to the second test pattern TP2 whose an upper surface is covered with the metal film.

By covering with the metal film, the first board connection pad CP-B1 and the second board connection pad CP-B2 may be electrically connected to each other through the third test pattern TP3.

Although a same signal is received from the main circuit board MB, a deviation in voltage and current between the first line L-b1 and the second line L-b2 may occur depending on the bonding resistances of the first board connection pad CP-B1 and the second board connection pad CP-B2.

However, since the first board connection pad CP-B1 and the second board connection pad CP-B2 are electrically connected to each other, the deviation in voltage and current between the first line L-b1 and the second line L-b2 may be eliminated and signal distortion may be reduced even though there is a difference in bonding resistance between the first board connection pad CP-B1 and the second board connection pad CP-B2.

By electrically connecting the test pattern to the connection circuit board according to an embodiment of the invention, e the degree of contact of the pads which transmit a signal from the main circuit board to the driving chip may be measured. The board connection pads electrically connected to the test pattern may be the pads which transmit a same signal from the main circuit board to the driving chip. The deviation in voltage and current, which may be caused due to the difference in bonding resistance between the pads, may be eliminated since the board connection pads which transmit a same signal are electrically connected to each other. The test pattern according to an embodiment of the invention may measure the combined resistance of the pads, which are the subjects of the test, and the bonding resistance of each of the pads in accordance with test processes.

In embodiments of the display device according the invention, the contact of specific pads included in the connection circuit board and electrically connected to each other may be tested, and reliability may be improved by the pad contact test.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
  a display panel;
  a main circuit board comprising a plurality of board pads arranged along a first direction;
  a connection circuit board electrically connected to the display panel on one side thereof and electrically connected to the main circuit board on another side thereof; and
  a driving chip disposed on the connection circuit board,
  wherein the connection circuit board comprises:
    a plurality of board connection pads respectively connected to the board pads;
    a plurality of lines connecting the board connection pads and the driving chip to each other; and
    a test pattern disposed spaced apart from the driving chip, and
  wherein a first line and a second line among the lines are electrically connected to driving pads of the driving chip, and are electrically connected to the test pattern via the driving pads of the driving chip, and wherein a same voltage is applied to the first line and the second line.

2. The display device of claim 1, wherein the first line and the second line are electrically connected to each other through the test pattern.

3. The display device of claim 1, wherein the test pattern comprises:
- a plurality of stripe patterns arranged along one direction; and
- a border pattern connected to opposing ends of each of the stripe patterns.

4. The display device of claim 3, wherein widths of the stripe patterns of the test pattern are the same as each other in a plan view.

5. The display device of claim 3, wherein the test pattern further comprises a metal film covering the stripe patterns.

6. The display device of claim 1, wherein the test pattern comprises an integrated plate-shaped pattern.

7. The display device of claim 1, wherein:
- the first line and the second line are spaced apart from each other along the first direction and have a shape symmetrical to each other with respect to an imaginary central axis extending along a second direction crossing the first direction; and
- the test pattern is symmetrical with respect to the imaginary central axis.

8. The display device of claim 1, wherein a line resistance of the first line and a line resistance of the second line are the same as each other.

9. The display device of claim 1, wherein the connection circuit board further comprises:
- a first connection line which electrically connects the first line and the test pattern to each other; and
- a second connection line which electrically connects the second line and the test pattern to each other,
- wherein the first line and the second line are respectively electrically connected to the first connection line and the second connection line on a region overlapping the driving chip.

10. The display device of claim 1, wherein the board pads and the board connection pads are bonded by a conductive adhesive member.

11. The display device of claim 1, wherein
- the connection circuit board further comprises a first sub-test pattern and a second sub-test pattern,
- wherein each of the first sub-test pattern and the second sub-test pattern is electrically connected to the test pattern.

12. The display device of claim 11, wherein an area of the first sub-test pattern and an area of the second sub-test pattern are the same as each other in a plan view.

13. The display device of claim 11, wherein the test pattern, the first sub-test pattern, and the second sub-test pattern comprise a same material as each other.

14. The display device of claim 11, wherein the first sub-test pattern and the second sub-test pattern are spaced apart from each other with the test pattern interposed therebetween in a plan view.

15. The display device of claim 11, wherein each of the first sub-test pattern and the second sub-test pattern has an integrated plate shape.

16. The display device of claim 11, wherein each of the first sub-test pattern and the second sub-test pattern comprises a plurality of stripe patterns connected to each other.

17. The display device of claim 1, wherein
- a third line and a fourth line among the lines are electrically connected to the test pattern;
- a same voltage is applied to the third line and the fourth line; and
- the same voltage applied to the third line and the fourth line is different from the same voltage applied to the first line and the second line.

18. A method for testing contact of pads of a display device, wherein the display device comprises: a display panel; a main circuit board; and a connection circuit board with a driving chip disposed thereon, which is electrically connected to the display panel and the main circuit board, wherein:
- the main circuit board comprises a plurality of board pads;
- the connection circuit board comprises a plurality of board connection pads respectively connected to the board pads, a plurality of lines connecting board connection pads and the driving chip to each other, and a test pattern disposed spaced apart from the driving chip; and
- a first line and a second line among the lines are spaced apart from each other and electrically connected to driving pads of the driving chip, and electrically connected to the test pattern via the driving pads of the driving chip, the method comprising:

inputting a same test signal to a first board connection pad among the board connection pads, which is connected to the first line, and a second board connection pad among the board connection pads, which is connected to the second line; and measuring a voltage of the test pattern.

19. The method of claim 18, wherein the connection circuit board further comprises a first sub-test pattern electrically connected to the first line and a second sub-test pattern electrically connected to the second line, the method further comprising, after the inputting the same test signal:

cutting the test pattern;

inputting a same test signal to the first board connection pad and the second board connection pad; and measuring a voltage of each of the first sub-test pattern and the second sub-test pattern.

20. The method of claim 19, further comprising, after the measuring the voltage of each of the first sub-test pattern and the second sub-test pattern, connecting cut portions of the test pattern to each other.

* * * * *